(12) United States Patent
Umezaki et al.

(10) Patent No.: US 12,100,368 B2
(45) Date of Patent: Sep. 24, 2024

(54) DISPLAY DEVICE AND ELECTRONIC DEVICE

(71) Applicant: Semiconductor Energy Laboratory Co., Ltd., Atsugi (JP)

(72) Inventors: Atsushi Umezaki, Kanagawa (JP); Hajime Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/370,427

(22) Filed: Sep. 20, 2023

(65) Prior Publication Data

US 2024/0005888 A1 Jan. 4, 2024

Related U.S. Application Data

(63) Continuation of application No. 17/943,284, filed on Sep. 13, 2022, now Pat. No. 11,769,462, which is a
(Continued)

(30) Foreign Application Priority Data

Feb. 18, 2010 (JP) .................................. 2010-033669

(51) Int. Cl.
*G09G 3/36* (2006.01)
*G02F 1/133* (2006.01)
(Continued)

(52) U.S. Cl.
CPC ....... *G09G 3/3677* (2013.01); *G02F 1/13306* (2013.01); *G02F 1/136286* (2013.01);
(Continued)

(58) Field of Classification Search
CPC ............... G09G 3/3677; G09G 3/3648; G09G 2310/0286; G09G 2310/0289;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 100399379 C 7/2008
EP 1209748 A 5/2002
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Premal R Patel
(74) *Attorney, Agent, or Firm* — Fish & Richardson P.C.

(57) ABSTRACT

A transistor whose channel region includes an oxide semiconductor is used as a pull down transistor. The band gap of the oxide semiconductor is 2.0 eV or more, preferably 2.5 eV or more, more preferably 3.0 eV or more. Thus, hot carrier degradation in the transistor can be suppressed. Accordingly, the circuit size of the semiconductor device including the pull down transistor can be made small. Further, a gate of a pull up transistor is made to be in a floating state by switching of on/off of the transistor whose channel region includes an oxide semiconductor. Note that when the oxide semiconductor is highly purified, the off-state current of the transistor can be 1 aA/μm ($1\times10^{-18}$ A/μm) or less. Therefore, the drive capability of the semiconductor device can be improved.

6 Claims, 16 Drawing Sheets

Related U.S. Application Data continuation of application No. 17/460,497, filed on Aug. 30, 2021, now Pat. No. 11,455,969, which is a continuation of application No. 16/785,710, filed on Feb. 10, 2020, now Pat. No. 11,170,728, which is a continuation of application No. 16/199,336, filed on Nov. 26, 2018, now Pat. No. 10,586,505, which is a continuation of application No. 15/147,086, filed on May 5, 2016, now Pat. No. 10,153,303, which is a continuation of application No. 14/070,700, filed on Nov. 4, 2013, now Pat. No. 9,337,191, which is a continuation of application No. 13/026,863, filed on Feb. 14, 2011, now Pat. No. 8,605,073.

(51) Int. Cl.
*G02F 1/1362* (2006.01)
*G11C 19/28* (2006.01)
*H01L 27/088* (2006.01)
*H01L 27/12* (2006.01)
*H01L 29/423* (2006.01)
*H01L 29/786* (2006.01)

(52) U.S. Cl.
CPC ............ *G09G 3/3648* (2013.01); *G11C 19/28* (2013.01); *G11C 19/287* (2013.01); *H01L 27/088* (2013.01); *H01L 27/1225* (2013.01); *H01L 27/124* (2013.01); *H01L 29/42356* (2013.01); *H01L 29/7869* (2013.01); *G09G 2310/0286* (2013.01); *G09G 2310/0289* (2013.01); *G09G 2310/08* (2013.01)

(58) Field of Classification Search
CPC ............ G09G 2310/08; G02F 1/13306; G02F 1/136286; G11C 19/28; G11C 19/287; H01L 27/088; H01L 27/1225; H01L 27/124; H01L 29/42356; H01L 29/7869
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,690,347 B2 | 2/2004 | Jeon et al. | |
| 6,727,522 B1 | 4/2004 | Kawasaki et al. | |
| 6,845,140 B2 | 1/2005 | Moon et al. | |
| 7,038,653 B2 | 5/2006 | Moon | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,289,096 B2 | 10/2007 | Jeon et al. | |
| 7,297,977 B2 | 11/2007 | Hoffman et al. | |
| 7,317,779 B2 | 1/2008 | Moon et al. | |
| 7,323,356 B2 | 1/2008 | Hosono et al. | |
| 7,372,300 B2 | 5/2008 | Tobita | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,436,923 B2 | 10/2008 | Tobita | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,486,269 B2 | 2/2009 | Moon | |
| 7,492,853 B2 | 2/2009 | Tobita | |
| 7,501,293 B2 | 3/2009 | Ito et al. | |
| 7,636,412 B2 | 12/2009 | Tobita | |
| 7,646,841 B2 | 1/2010 | Moon et al. | |
| 7,664,218 B2 | 2/2010 | Tobita | |
| 7,674,650 B2 | 3/2010 | Akimoto et al. | |
| 7,687,808 B2 | 3/2010 | Umezaki | |
| 7,696,974 B2 | 4/2010 | Moon et al. | |
| 7,732,819 B2 | 6/2010 | Akimoto et al. | |
| 7,816,680 B2 | 10/2010 | Kim et al. | |
| 7,825,888 B2 | 11/2010 | Tobita et al. | |
| 7,831,010 B2 | 11/2010 | Tobita | |
| 7,859,510 B2 | 12/2010 | Umezaki | |
| 7,910,490 B2 | 3/2011 | Akimoto et al. | |
| 7,932,521 B2 | 4/2011 | Akimoto et al. | |
| 7,932,888 B2 | 4/2011 | Miyake | |
| 7,964,876 B2 | 6/2011 | Umezaki | |
| 7,978,274 B2 | 7/2011 | Umezaki et al. | |
| 8,054,279 B2 | 11/2011 | Umezaki et al. | |
| 8,143,115 B2 | 3/2012 | Omura et al. | |
| 8,148,721 B2 | 4/2012 | Hayashi et al. | |
| 8,232,552 B2 | 7/2012 | Yano et al. | |
| 8,248,353 B2 | 8/2012 | Liu et al. | |
| 8,274,077 B2 | 9/2012 | Akimoto et al. | |
| 8,314,765 B2 | 11/2012 | Umezaki | |
| 8,330,492 B2 | 12/2012 | Umezaki | |
| 8,330,887 B2 | 12/2012 | Kurokawa et al. | |
| 8,456,386 B2 | 6/2013 | Shin | |
| 8,456,396 B2 | 6/2013 | Umezaki | |
| 8,462,100 B2 | 6/2013 | Umezaki | |
| 8,466,463 B2 | 6/2013 | Akimoto et al. | |
| 8,493,309 B2 | 7/2013 | Tobita | |
| 8,508,459 B2 | 8/2013 | Miyake | |
| 8,520,159 B2 | 8/2013 | Umezaki et al. | |
| 8,564,523 B2 | 10/2013 | Moon | |
| 8,587,094 B2 | 11/2013 | Kawasaki | |
| 8,598,591 B2 | 12/2013 | Umezaki | |
| 8,629,069 B2 | 1/2014 | Akimoto et al. | |
| 8,643,586 B2 | 2/2014 | Umezaki | |
| 8,669,550 B2 | 3/2014 | Akimoto et al. | |
| 8,743,044 B2 | 6/2014 | Umezaki et al. | |
| 8,766,901 B2 | 7/2014 | Miyake | |
| 8,774,347 B2 | 7/2014 | Umezaki | |
| 8,790,959 B2 | 7/2014 | Akimoto et al. | |
| 8,796,069 B2 | 8/2014 | Akimoto et al. | |
| 8,816,949 B2 | 8/2014 | Tobita | |
| 8,902,145 B2 | 12/2014 | Umezaki et al. | |
| 8,908,115 B2 | 12/2014 | Umezaki et al. | |
| 9,036,767 B2 | 5/2015 | Umezaki | |
| 9,064,753 B2 | 6/2015 | Miyake | |
| 9,070,593 B2 | 6/2015 | Umezaki | |
| 9,184,183 B2 | 11/2015 | Umezaki | |
| 9,214,473 B2 | 12/2015 | Umezaki | |
| 9,263,468 B2 | 2/2016 | Umezaki et al. | |
| 9,311,876 B2 | 4/2016 | Umezaki | |
| 9,335,599 B2 | 5/2016 | Umezaki | |
| 9,461,071 B2 | 10/2016 | Umezaki | |
| 9,536,903 B2 | 1/2017 | Umezaki et al. | |
| 9,905,699 B2 | 2/2018 | Hayashi et al. | |
| 9,954,010 B2 | 4/2018 | Umezaki | |
| 10,304,868 B2 | 5/2019 | Umezaki | |
| 10,720,452 B2 | 7/2020 | Umezaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, II et al. | |
| 2003/0231735 A1 | 12/2003 | Moon et al. | |
| 2004/0038446 A1 | 2/2004 | Takeda et al. | |
| 2004/0046729 A1 | 3/2004 | Moon | |
| 2004/0127038 A1 | 7/2004 | Carcia et al. | |
| 2004/0165692 A1 | 8/2004 | Moon et al. | |
| 2004/0189584 A1 | 9/2004 | Moon | |
| 2005/0008114 A1* | 1/2005 | Moon | G11C 19/184 |
| | | | 377/64 |
| 2005/0017302 A1 | 1/2005 | Hoffman | |
| 2005/0104836 A1 | 5/2005 | Lin et al. | |
| 2005/0199959 A1 | 9/2005 | Chiang et al. | |
| 2006/0001111 A1 | 1/2006 | Tsuchiya et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |

(56) References Cited

U.S. PATENT DOCUMENTS

| | | |
|---|---|---|
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0256066 A1 | 11/2006 | Moon |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0052658 A1 | 3/2007 | Kim |
| 2007/0054467 A1 | 3/2007 | Currie et al. |
| 2007/0054507 A1 | 3/2007 | Kaji et al. |
| 2007/0075959 A1 | 4/2007 | Tobita |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0247932 A1 | 10/2007 | Tobita |
| 2007/0252928 A1 | 11/2007 | Ito et al. |
| 2007/0272922 A1 | 11/2007 | Kim et al. |
| 2007/0274433 A1 | 11/2007 | Tobita |
| 2007/0287296 A1 | 12/2007 | Chang |
| 2008/0006877 A1 | 1/2008 | Mardilovich et al. |
| 2008/0007296 A1 | 1/2008 | Umezaki |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0051639 A1 | 2/2008 | Iliff |
| 2008/0068326 A1 | 3/2008 | Chen et al. |
| 2008/0073653 A1 | 3/2008 | Iwasaki |
| 2008/0079001 A1 | 4/2008 | Umezaki et al. |
| 2008/0079685 A1 | 4/2008 | Umezaki et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0230823 A1 | 9/2008 | Kawasaki |
| 2008/0253499 A1 | 10/2008 | Chan et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0015570 A1 | 1/2009 | Yamazaki |
| 2009/0021536 A1 | 1/2009 | Abe et al. |
| 2009/0051639 A1 | 2/2009 | Liu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0224245 A1 | 9/2009 | Umezaki |
| 2009/0262058 A1 | 10/2009 | Pak et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0102377 A1 | 4/2010 | Likawa et al. |
| 2010/0109002 A1 | 5/2010 | Itagaki et al. |
| 2010/0134396 A1 | 6/2010 | Umezaki |
| 2010/0177023 A1 | 7/2010 | Han |
| 2010/0295838 A1 | 11/2010 | Umezaki et al. |
| 2011/0104851 A1 | 5/2011 | Akimoto et al. |
| 2011/0121290 A1 | 5/2011 | Akimoto et al. |
| 2012/0142131 A1 | 6/2012 | Takahashi et al. |
| 2012/0168750 A1 | 7/2012 | Hayashi et al. |
| 2014/0061638 A1 | 3/2014 | Umezaki |
| 2015/0077676 A1 | 3/2015 | Umezaki et al. |
| 2016/0141309 A1 | 5/2016 | Umezaki et al. |
| 2016/0190174 A1 | 6/2016 | Umezaki |
| 2018/0145181 A1 | 5/2018 | Hayashi et al. |
| 2020/0295050 A1 | 9/2020 | Umezaki |

FOREIGN PATENT DOCUMENTS

| | | |
|---|---|---|
| EP | 1231594 A | 8/2002 |
| EP | 1445862 A | 8/2004 |
| EP | 1737044 A | 12/2006 |
| EP | 1770788 A | 4/2007 |
| EP | 1843312 A | 10/2007 |
| EP | 1895545 A | 3/2008 |
| EP | 1906414 A | 4/2008 |
| EP | 1976009 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2302685 A | 3/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-052494 A | 2/2001 |
| JP | 2002-076356 A | 3/2002 |
| JP | 2002-258819 A | 9/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-078172 A | 3/2004 |
| JP | 2004-103226 A | 4/2004 |
| JP | 2004-103957 A | 4/2004 |
| JP | 2004-246358 A | 9/2004 |
| JP | 2004-273614 A | 9/2004 |
| JP | 2004-273732 A | 9/2004 |
| JP | 2005-050502 A | 2/2005 |
| JP | 2005-251335 A | 9/2005 |
| JP | 2007-072463 A | 3/2007 |
| JP | 2007-123861 A | 5/2007 |
| JP | 2007-128029 A | 5/2007 |
| JP | 2007-207411 A | 8/2007 |
| JP | 2007-207413 A | 8/2007 |
| JP | 2007-293995 A | 11/2007 |
| JP | 2007-317288 A | 12/2007 |
| JP | 2007-317344 A | 12/2007 |
| JP | 2008-009393 A | 1/2008 |
| JP | 2008-083692 A | 4/2008 |
| JP | 2008-089874 A | 4/2008 |
| JP | 2008-089915 A | 4/2008 |
| JP | 2008-107807 A | 5/2008 |
| JP | 2008-108374 A | 5/2008 |
| JP | 2008-140489 A | 6/2008 |
| JP | 2008-217902 A | 9/2008 |
| JP | 2008-243928 A | 10/2008 |

(56) References Cited

FOREIGN PATENT DOCUMENTS

| JP | 2008-251094 A | 10/2008 |
|---|---|---|
| JP | 2008-276849 A | 11/2008 |
| JP | 2009-049985 A | 3/2009 |
| JP | 2009-055008 A | 3/2009 |
| JP | 2009-140608 A | 6/2009 |
| JP | 2009-245564 A | 10/2009 |
| JP | 2010-024087 A | 2/2010 |
| JP | 2010-027194 A | 2/2010 |
| JP | 2010-028021 A | 2/2010 |
| JP | 2010-033690 A | 2/2010 |
| KR | 2006-0049216 A | 5/2006 |
| KR | 2007-0093912 A | 9/2007 |
| KR | 2008-0014414 A | 2/2008 |
| KR | 2008-0034808 A | 4/2008 |
| KR | 2009-0089450 A | 8/2009 |
| KR | 2009-0124329 A | 12/2009 |
| TW | 200733032 | 9/2007 |
| TW | 200746017 | 12/2007 |
| TW | 200802270 | 1/2008 |
| TW | 200818215 | 4/2008 |
| TW | 200849554 | 12/2008 |
| WO | WO-2002/065062 | 8/2002 |
| WO | WO-2003/107314 | 12/2003 |
| WO | WO-2004/114391 | 12/2004 |
| WO | WO-2008/069056 | 6/2008 |
| WO | WO-2008/069255 | 6/2008 |
| WO | WO-2010/061723 | 6/2010 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Godo.H et al., "P-9: Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Oxygen Vacancies in ZnO", Appl. Phys. Lett. (Applied Physics Letters) , 2005, vol. 87, pp. 122102-1-122102-3.
Janotti.A et al., "Native Point Defects in ZnO", Phys. Rev. B (Physical Review. B), Oct. 4, 2007, vol. 76, No. 16, pp. 165202-1-165202-22.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kawamura.T et al., "1.5-V Operating Fully-Depleted Amorphous Oxide Thin Film Transistors Achieved by 63-mV/dec Subthreshold Slope", IEDM 08: Technical Digest of International Electron Devices Meeting, Dec. 15, 2008, pp. 77-80.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper: Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kimizuka.N et al., "SPINEL, YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4: Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2011/052195) Dated Apr. 26, 2011.

Written Opinion (Application No. PCT/JP2011/052195) Dated Apr. 26, 2011.

Korean Office Action (Application No. 2018-7025477) Dated Dec. 30, 2018.

Taiwanese Office Action (Application No. 107146136) Dated Dec. 26, 2019.

* cited by examiner

DISPLAY DEVICE AND ELECTRONIC DEVICE

CROSS-REFERENCE TO RELATED APPLICATIONS

This application is a continuation of U.S. application Ser. No. 17/943,284, filed Sep. 13, 2022, now allowed, which is a continuation of U.S. application Ser. No. 17/460,497, filed Aug. 30, 2021, now U.S. Pat. No. 11,455,969, which is a continuation of U.S. application Ser. No. 16/785,710, filed Feb. 10, 2020, now U.S. Pat. No. 11,170,728, which is a continuation of U.S. application Ser. No. 16/199,336, filed Nov. 26, 2018, now U.S. Pat. No. 10,586,505, which is a continuation of U.S. application Ser. No. 15/147,086, filed May 5, 2016, now U.S. Pat. No. 10,153,303, which is a continuation of U.S. application Ser. No. 14/070,700, filed Nov. 4, 2013, now U.S. Pat. No. 9,337,191, which is a continuation of U.S. application Ser. No. 13/026,863, filed Feb. 14, 2011, now U.S. Pat. No. 8,605,073, which claims the benefit of a foreign priority application filed in Japan as Serial No. 2010-033669 on Feb. 18, 2010, all of which are incorporated by reference.

TECHNICAL FIELD

One embodiment of the present invention relates to display devices. For example, one embodiment of the present invention relates to liquid crystal display devices. One of the technical fields relates to display devices in which images are displayed when pixels are selected by gate signal lines and source signal lines. Further, one of the technical fields relates to semiconductor devices such as driver circuits used in display devices and electronic devices including display devices.

BACKGROUND ART

Gate driver circuits including amorphous silicon transistors (also referred to as a-Si TFTs) have been developed. Such a gate driver circuit has a problem of malfunctions due to a shift in the threshold voltage of a transistor for keeping the potential of a gate line low (at an L level) (such a transistor is also referred to as a pull down transistor). In order to solve this problem, a gate driver circuit in which a pull down transistor is repeatedly turned on and off in a period during which the potential of a gate line is kept low has been disclosed (see References 1 and 2, for example). With such a gate driver circuit, a period during which the pull down transistor is on can be shortened; thus, deterioration of the pull down transistor can be suppressed.

In addition, the gate driver circuit including amorphous silicon transistors includes a transistor for controlling timing of outputting high voltage to the gate line (such a transistor is also referred to as a pull up transistor). One of a source and a drain of the pull up transistor is connected to a clock signal line. The other of the source and the drain of the pull up transistor is connected to a gate signal line. A driving method by which the potential of a gate of the pull up transistor is made higher than the high (H-level) potential of a clock signal by capacitive coupling is employed. In order to realize the driving method, it is necessary to make the gate of the pull up transistor be in a floating state. Thus, it is necessary to turn off all the transistors that are connected to the gate of the pull up transistor.

REFERENCE

[Reference 1] Japanese Published Patent Application No. 2007-207413
[Reference 2] Japanese Published Patent Application No. 2008-009393

DISCLOSURE OF INVENTION

In a conventional technique, in order that a pull down transistor may be repeatedly turned on and off, a circuit for controlling the on-off of the pull down transistor is needed. Thus, there is a limit to the decrease in the circuit size of a semiconductor device. In addition, even when all the transistors that are connected to a gate of the pull up transistor are turned off, electrical charges accumulated in the gate of the pull up transistor are lost due to the off-state current of the transistor as time passes. Therefore, it is difficult to lower the drive frequency of a semiconductor device such as a gate driver circuit. Further, the range of drive frequency at which the semiconductor device can operate is narrowed. Accordingly, there is a limit to improvement in the drive capability of the semiconductor device.

In view of the foregoing problems, an object of one embodiment of the present invention is to make the circuit size of a semiconductor device small. Further, an object of one embodiment of the present invention is to improve the drive capability of the semiconductor device. Note that in one embodiment of the present invention, there is no need to achieve all the objects.

The objects can be achieved when a transistor whose channel region includes an oxide semiconductor is used as the pull up transistor or the pull down transistor. Note that the oxide semiconductor is an oxide semiconductor which is highly purified by drastic removal of impurities (hydrogen, water, and the like) which serve as electron donors.

Note that the band gap of the oxide semiconductor is 2.0 eV or more, preferably 2.5 eV or more, more preferably 3.0 eV or more. Thus, in the transistor whose channel region includes the oxide semiconductor, impact ionization and avalanche breakdown do not easily occur. That is, carriers (electrons) in the oxide semiconductor are not easily accelerated. Therefore, in the transistor whose channel region includes the oxide semiconductor, fluctuations in the threshold voltage of the transistor due to injection of carriers (electrons) into a gate insulating layer (so-called hot carrier degradation) can be suppressed.

Further, the number of carriers in the transistor whose channel region includes the oxide semiconductor is extremely small. Thus, off-state current per micrometer of the channel width can be 1 aA ($1\times10^{-18}$ A) or less. This off-state current is represented as 1 aA/μm.

In other words, one embodiment of the present invention is a display device which includes a plurality of gate signal lines, a plurality of source signal lines, a pixel provided in a region where the gate signal line and the source signal line intersect with each other, and a gate driver circuit electrically connected to the plurality of gate signal lines. The gate driver circuit includes a first transistor, a second transistor, and an inverter circuit. A first terminal of the first transistor is electrically connected to a first wiring, and a second terminal of the first transistor is electrically connected to a second wiring. A first terminal of the second transistor is electrically connected to a third wiring, and a second terminal of the second transistor is electrically connected to the second wiring. An input terminal of the inverter circuit is electrically connected to a gate of the first transistor, and an output terminal of the inverter circuit is electrically connected to a gate of the second transistor. A channel region of each of the first transistor and the second transistor includes an oxide semiconductor. The off-state current of each of the first transistor and the second transistor is 1 aA/μm or less.

One embodiment of the present invention is a display device which includes a plurality of gate signal lines, a plurality of source signal lines, a pixel provided in a region where the gate signal line and the source signal line intersect with each other, and a gate driver circuit electrically connected to the plurality of gate signal lines. The gate driver circuit includes a first transistor, a second transistor, and an inverter circuit. A first terminal of the first transistor is electrically connected to a first wiring, and a second terminal of the first transistor is electrically connected to a second wiring. A first terminal of the second transistor is electrically connected to a third wiring, and a second terminal of the second transistor is electrically connected to a gate of the first transistor. An input terminal of the inverter circuit is electrically connected to the gate of the first transistor, and an output terminal of the inverter circuit is electrically connected to a gate of the second transistor. A channel region of each of the first transistor and the second transistor includes an oxide semiconductor. The off-state current of each of the first transistor and the second transistor is 1 aA/μm or less.

One embodiment of the present invention is a display device which includes a plurality of gate signal lines, a plurality of source signal lines, a pixel provided in a region where the gate signal line and the source signal line intersect with each other, and a gate driver circuit electrically connected to the plurality of gate signal lines. The gate driver circuit includes a first transistor, a second transistor, a third transistor, and an inverter circuit. A first terminal of the first transistor is electrically connected to a first wiring, and a second terminal of the first transistor is electrically connected to a second wiring. A first terminal of the second transistor is electrically connected to a third wiring, and a second terminal of the second transistor is electrically connected to the second wiring. A first terminal of the third transistor is electrically connected to a fourth wiring; a second terminal of the third transistor is electrically connected to a gate of the first transistor; and a gate of the third transistor is electrically connected to the fourth wiring. An input terminal of the inverter circuit is electrically connected to the gate of the first transistor, and an output terminal of the inverter circuit is electrically connected to a gate of the second transistor. A channel region of each of the first to third transistors includes an oxide semiconductor. The off-state current of each of the first to third transistors is 1 aA/μm or less.

One embodiment of the present invention is a display device which includes a plurality of gate signal lines, a plurality of source signal lines, a pixel provided in a region where the gate signal line and the source signal line intersect with each other, and a gate driver circuit electrically connected to the plurality of gate signal lines. The gate driver circuit includes a first transistor, a second transistor, a third transistor, and an inverter circuit. A first terminal of the first transistor is electrically connected to a first wiring, and a second terminal of the first transistor is electrically connected to a second wiring. A first terminal of the second transistor is electrically connected to a third wiring, and a second terminal of the second transistor is electrically connected to the second wiring. A first terminal of the third transistor is electrically connected to the third wiring; a second terminal of the third transistor is electrically connected to a gate of the first transistor; and a gate of the third transistor is electrically connected to a fourth wiring. An input terminal of the inverter circuit is electrically connected to the gate of the first transistor, and an output terminal of the inverter circuit is electrically connected to a gate of the second transistor. A channel region of each of the first to third transistors includes an oxide semiconductor. The off-state current of each of the first to third transistors is 1 aA/μm or less.

One embodiment of the present invention is a display device which includes a plurality of gate signal lines, a plurality of source signal lines, a pixel provided in a region where the gate signal line and the source signal line intersect with each other, and a gate driver circuit electrically connected to the plurality of gate signal lines. The gate driver circuit includes a first transistor, a second transistor, a third transistor, a fourth transistor, and an inverter circuit. A first terminal of the first transistor is electrically connected to a first wiring, and a second terminal of the first transistor is electrically connected to a second wiring. A first terminal of the second transistor is electrically connected to a third wiring, and a second terminal of the second transistor is electrically connected to the second wiring. A first terminal of the third transistor is electrically connected to a fourth wiring; a second terminal of the third transistor is electrically connected to a gate of the first transistor; and a gate of the third transistor is electrically connected to the fourth wiring. A first terminal of the fourth transistor is electrically connected to the third wiring; a second terminal of the fourth transistor is electrically connected to the gate of the first transistor; and a gate of the fourth transistor is electrically connected to a fifth wiring. An input terminal of the inverter circuit is electrically connected to the gate of the first transistor, and an output terminal of the inverter circuit is electrically connected to a gate of the second transistor. A channel region of each of the first to fourth transistors includes an oxide semiconductor. The off-state current of each of the first to fourth transistors is 1 aA/μm or less.

One embodiment of the present invention is an electronic device including the display device and an operation switch which controls an image of the display device.

In this specification and the like, when an object is explicitly described in a singular form, the object is preferably singular. However, the present invention is not limited to this, and the object can be plural. Similarly, when an object is explicitly described in a plural form, the object is preferably plural. However, the present invention is not limited to this, and the object can be singular.

In this specification and the like, terms such as "first", "second", and "third" are used for distinguishing various elements, members, regions, layers, and areas from others. Therefore, the terms such as "first", "second", and "third" do not limit the number of the elements, members, regions, layers, areas, or the like. Further, for example, the term "first" can be replaced with the term "second", "third", or the like.

In one embodiment of the present invention, a transistor whose channel region includes an oxide semiconductor is used as a pull down transistor. Thus, hot carrier degradation in the pull down transistor can be suppressed. Therefore, the number of transistors serving as pull down transistors can be reduced. Accordingly, the size of a circuit for controlling the on-off of a pull down transistor can be made small. Consequently, the circuit size of a semiconductor device including the pull down transistor can be made small.

Further, in one embodiment of the present invention, a gate of a pull up transistor is made to be in a floating state by switching of the on-off of a transistor whose channel region includes an oxide semiconductor. Thus, electrical charges accumulated in the gate of the pull up transistor can be held for a long period of time. Therefore, the drive frequency of a semiconductor device including the pull up transistor can be lowered. Further, the range of drive frequency at which the semiconductor device can operate can be broadened. Accordingly, the drive capability of the semiconductor device can be improved.

BEST MODE FOR CARRYING OUT THE INVENTION

Figure 1A:
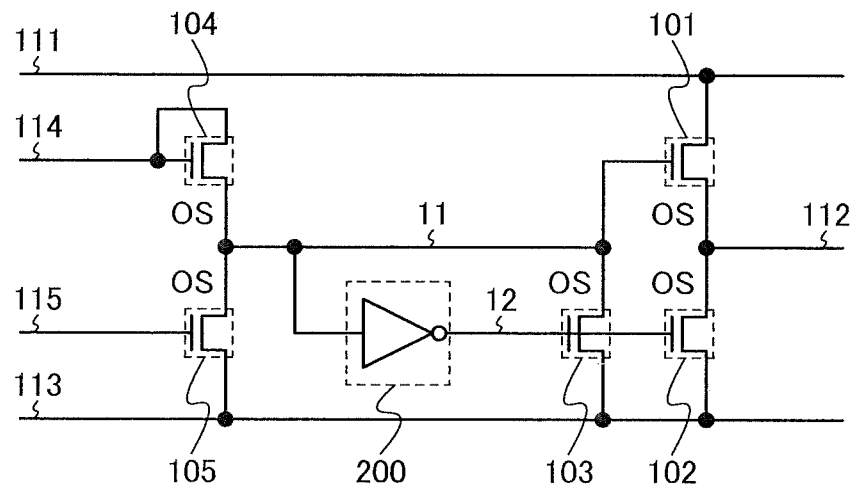
FIGS. 1A and 1B illustrate structures of circuits in Embodiment 1.

Embodiments will be described below with reference to the drawings. Note that the embodiments can be implemented in various different ways. It will be readily appreciated by those skilled in the art that modes and details of the embodiments can be changed in various ways without departing from the spirit and scope of the present invention. Therefore, the present invention should not be construed as being limited to the description of the embodiments. Note that in structures described below, the same portions or portions having similar functions are denoted by common reference numerals in different drawings, and detailed description thereof is not repeated. In the reference drawings, the size, the thickness of layers, or regions are exaggerated for clarity in some cases. Therefore, the embodiments of the present invention are not limited to such scales.

Embodiment 1

In this embodiment, a circuit in a display device which is one embodiment of the present invention is described.

FIG. 1A illustrates a structure example of a circuit which includes a transistor 101, a transistor 102, a transistor 103, a transistor 104, a transistor 105, and a circuit 200. The transistors included in the circuit illustrated in FIG. 1A are n-channel transistors. An n-channel transistor is turned on when a potential difference between a gate and a source is higher than the threshold voltage.

Note that an oxide semiconductor may be used for a semiconductor layer of the transistor included in the circuit illustrated in FIG. 1A. It is preferable that the oxide semiconductor be an intrinsic (i-type) or substantially intrinsic oxide semiconductor which is obtained by sufficiently lowering a hydrogen concentration to be highly purified and has sufficiently low carrier density. With the oxide semiconductor, the subthreshold swing of the transistor can be decreased. The off-state current of the transistor can be reduced. The withstand voltage of the transistor can be improved. The temperature characteristics of the transistor can be improved. Deterioration of the transistor can be suppressed. Specifically, the amount of shifts in the threshold voltage of the transistor can be reduced.

Note that the oxide semiconductor can be used for semiconductor layers of some transistors, and a semiconductor which is different from the oxide semiconductor (for example, silicon (e.g., amorphous silicon, microcrystalline silicon, or polycrystalline silicon), an organic semiconductor, or the like) can be used for semiconductor layers of the other transistors. Note that the oxide semiconductor is used for at least a semiconductor layer of a transistor whose source or drain is connected to a gate of the transistor 101.

The connection relations in the circuit illustrated in FIG. 1A are described. A first terminal of the transistor 101 is connected to a wiring 111. A second terminal of the transistor 101 is connected to a wiring 112. A first terminal of the transistor 102 is connected to a wiring 113. A second terminal of the transistor 102 is connected to the wiring 112. A first terminal of the transistor 103 is connected to the wiring 113. A second terminal of the transistor 103 is connected to a gate of the transistor 101. A gate of the transistor 103 is connected to a gate of the transistor 102. A first terminal of the transistor 104 is connected to a wiring 114. A second terminal of the transistor 104 is connected to the gate of the transistor 101. A gate of the transistor 104 is connected to the wiring 114. A first terminal of the transistor 105 is connected to the wiring 113. A second terminal of the transistor 105 is connected to the gate of the transistor 101. A gate of the transistor 105 is connected to a wiring 115. An input terminal of the circuit 200 is connected to the gate of the transistor 101. An output terminal of the circuit 200 is connected to the gate of the transistor 102. Note that the gate of the transistor 101 is denoted by a node 11, and the gate of the transistor 102 is denoted by a node 12. Note that the circuit 200 can be connected to a given wiring or a given node depending on its structure. For example, the circuit 200 can be connected to one or more of the wiring 1, the wiring 112, the wiring 113, the wiring 114, the wiring 115, the node 11, and the node 12.

Note that since a source and a drain of a transistor change depending on the structure, the operating condition, and the like of the transistor, it is difficult to define which is a source or a drain. Therefore, in this document, one of a source and a drain is referred to as a first terminal and the other thereof is referred to as a second terminal.

An example of the structure of the circuit 200 is described with reference to FIG. 1B. The circuit 200 includes a transistor 201, a transistor 202, a transistor 203, and a transistor 204. A first terminal of the transistor 201 is connected to a wiring 116. A second terminal of the transistor 201 is connected to the node 12. A first terminal of the transistor 202 is connected to the wiring 13. A second terminal of the transistor 202 is connected to the node 12. A gate of the transistor 202 is connected to the node 11. A first terminal of the transistor 203 is connected to the wiring 116. A second terminal of the transistor 203 is connected to a gate of the transistor 201. A gate of the transistor 203 is connected to the wiring 116. A first terminal of the transistor 204 is connected to the wiring 113. A second terminal of the transistor 204 is connected to the gate of the transistor 201. A gate of the transistor 204 is connected to the node 11.

A clock signal is input to the wiring 111. An output signal of the circuit in this embodiment is input to the wiring 112. Voltage $V_2$ is supplied to the wiring 113. A start pulse is input to the wiring 114. A reset signal is input to the wiring 115. Voltage $V_1$ is supplied to the wiring 116. Here, the H-level potential of the signal input to the wiring 111, the wiring 112, the wiring 114, and the wiring 115 is referred to as a potential $V_1$ for convenience, and the L-level potential of the signal input to the wiring 111, the wiring 112, the wiring 114, and the wiring 115 is referred to as a potential $V_2$ for convenience.

The wiring 111 is used for transmitting a signal such as a clock signal from an external circuit such as a controller to the circuit in this embodiment. The wiring 111 functions as a signal line or a clock signal line. The wiring 112 is used for transmitting an output signal of the circuit in this embodiment to a circuit such as a pixel circuit or a demultiplexer. The wiring 112 functions as a signal line or a gate signal line. The wiring 113 is used for supplying power supply voltage such as the voltage $V_2$ from an external circuit such as a power supply circuit to the circuit in this embodiment. The wiring 113 functions as a power supply line, a negative power supply line, or a ground line. The wiring 114 is used for transmitting a start signal from another circuit or an external circuit such as a timing controller to the circuit in this embodiment. The wiring 114 functions as a signal line. The wiring 115 is used for transmitting a reset signal from another circuit or an external circuit such as a timing controller to the circuit in this embodiment. The wiring 115 functions as a signal line. The wiring 116 is used for supplying power supply voltage such as the voltage $V_1$ from an external circuit such as a power supply circuit to the circuit in this embodiment. The wiring 116 functions as a power supply line or a positive power supply line.

The transistor 101 functions as a switch for controlling electrical continuity between the wiring 111 and the wiring 112. Further, the transistor 101 has a function of controlling timing of raising the potential of the node 11 by capacitive coupling between the second terminal and the gate of the transistor 101. The transistor 102 functions as a switch for controlling electrical continuity between the wiring 113 and the wiring 112. The transistor 103 functions as a switch for controlling electrical continuity between the wiring 113 and the node 11. The transistor 104 functions as a switch for controlling electrical continuity between the wiring 114 and the node 11. Further, the transistor 104 functions as a diode whose input terminal is connected to the wiring 114 and whose output terminal is connected to the node 11. The transistor 105 functions as a switch for controlling electrical continuity between the wiring 113 and the node 11. The transistor 201 functions as a switch for controlling electrical continuity between the wiring 116 and the node 12. Further, the transistor 201 has a function of controlling timing of raising the potential of a node 21 by capacitive coupling between the second terminal and the gate of the transistor 201. The transistor 202 functions as a switch for controlling electrical continuity between the wiring 113 and the node 12. The transistor 203 functions as a switch for controlling electrical continuity between the wiring 116 and the node 12. Further, the transistor 203 functions as a diode whose input terminal is connected to the wiring 116 and whose output terminal is connected to the node 21. The transistor 204 functions as a switch for controlling electrical continuity between the wiring 113 and the node 21.

The circuit 200 functions as a control circuit for controlling the potential of the node 12 and the on-off of the transistor 102 and the transistor 103. Further, the circuit 200 functions as an inverter circuit for inverting the potential of the node 11 and outputting the inverted potential to the node 12.

Figure 1B:
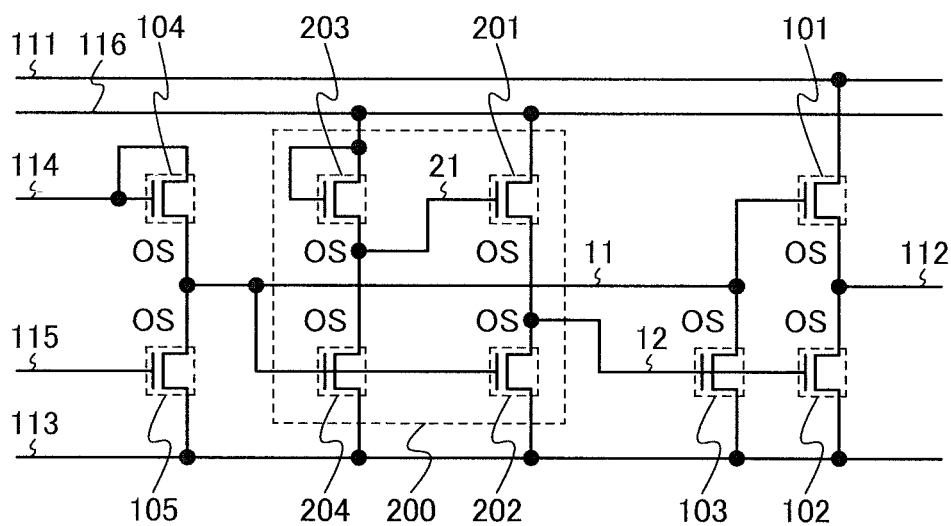

Next, an example of the operation of the circuits in FIGS. 1A and 1B is described with reference to a timing chart in FIG. 2A. Here, for example, the circuit in FIG. 1B is described. The timing chart in FIG. 2A includes a period A, a period B, a period C, and a period D.

In the period A, the potential of the wiring 111 (potential $V_{111}$) is at $V_2$; the potential of the wiring 114 (potential $V_{114}$) is at $V_1$; and the potential of the wiring 115 (potential $V_{115}$) is at $V_2$. Thus, the transistor 104 is turned on, so that electrical continuity between the wiring 114 and the node 11 is established. The transistor 105 is turned off. At this time, the circuit 200 sets the potential of the node 12 (potential $V_{12}$) at $V_2$. Thus, the transistor 102 is turned off, so that electrical continuity between the wiring 113 and the wiring 112 is not established. The transistor 103 is turned off so that electrical continuity between the wiring 113 and the node 11 is not established. Thus, the potential of the wiring 114 is supplied to the node 11, so that the potential of the node 11 (potential $V_{11}$) starts to rise. Then, the potential of the node 11 exceeds $V_2+V_{th101}$ ($V_{th101}$ represents the threshold voltage of the transistor 101). Thus, the transistor 101 is turned on, so that electrical continuity between the wiring 111 and the wiring 112 is established. Accordingly, the potential of the wiring 111 is supplied to the wiring 112, so that the potential of the wiring 112 (potential $V_{112}$) is at $V_2$ (see FIG. 2B).

Figure 3A:
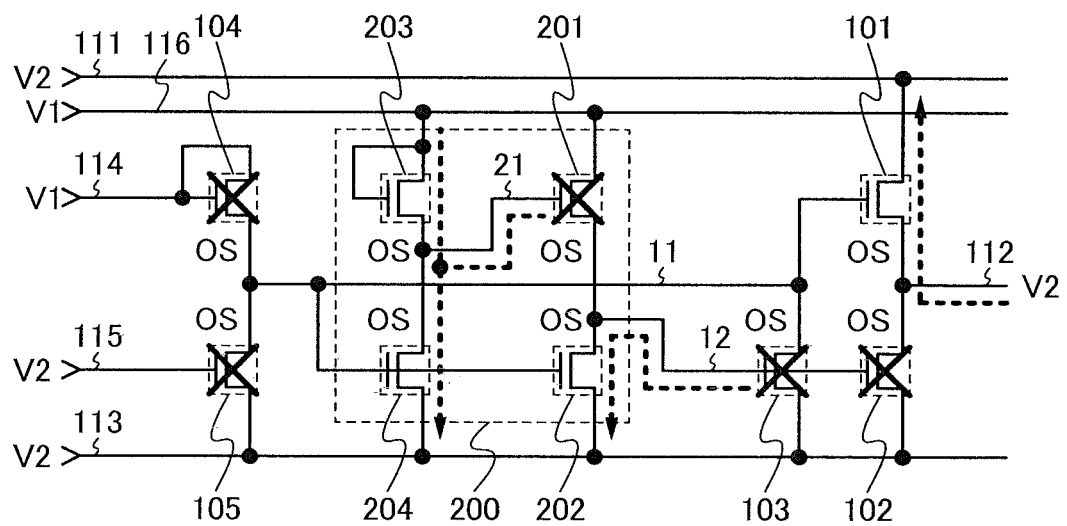
FIGS. 3A and 3B are schematic views for illustrating operation of the circuit in Embodiment 1.

After that, the potential of the node 11 continuously rises. Then, the potential of the node 11 reaches $V_1-V_{th104}$ ($V_{th104}$ represents the threshold voltage of the transistor 104). Thus, the transistor 104 is turned off, so that electrical continuity between the wiring 114 and the node 11 is not established. Accordingly, the node 11 is made to be in a floating state, so that the potential of the node 11 is kept at $V_1-V_{th104}$ ($V_1-V_{th104}$ is higher than $V_2+V_{th101}$) (see FIG. 3A).

Figure 3B:
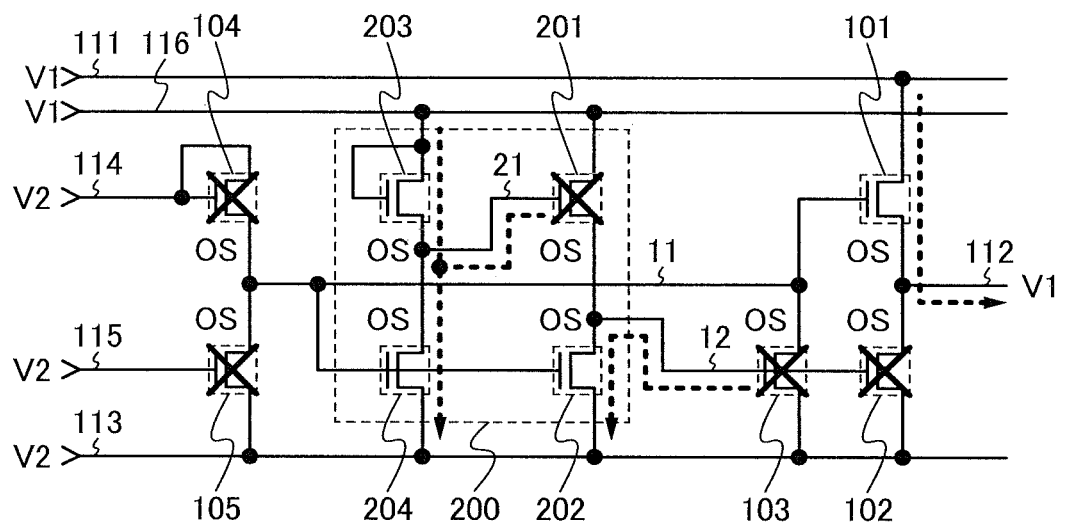

In the period B, the potential of the wiring 111 is at $V_1$; the potential of the wiring 114 is at $V_2$; and the potential of the wiring 115 is kept at $V_2$. Thus, the transistor 104 is kept off, so that electrical continuity between the wiring 114 and the node 11 remains unestablished. The transistor 105 is kept off. At this time, the circuit 200 continuously sets the potential of the node 12 at $V_2$. Thus, the transistor 102 is kept off, so that electrical continuity between the wiring 113 and the wiring 112 remains unestablished. The transistor 103 is kept off, so that electrical continuity between the wiring 113 and the node 11 remains unestablished. Thus, the node 11 is kept in a floating state, so that the potential of the node 11 is kept at $V_1-V_{th104}$. Thus, the transistor 101 is kept on, so that electrical continuity between the wiring 111 and the wiring 112 remains established. At this time, the potential of the wiring 111 is at $V_1$. Thus, the potential of the wiring 112 starts to rise. Then, since the node 11 is in a floating state, the potential of the node 11 starts to rise by parasitic capacitance between the gate and the second terminal of the transistor 101. Finally, the potential of the node 11 reaches $V_1+V_{th101}+V_a$ ($V_a$ is a positive potential). Accordingly, the potential of the wiring 112 can rise to $V_1$ (see FIG. 3B). Such operation is referred to as bootstrap operation.

Figure 4A:
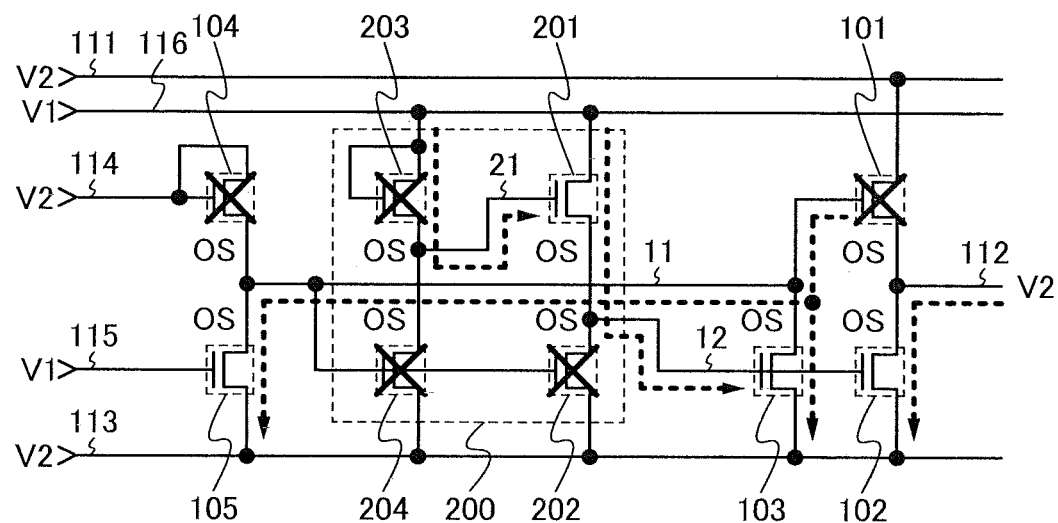
FIGS. 4A and 4B are schematic views for illustrating operation of the circuit in Embodiment 1.

In the period C, the potential of the wiring 111 is at $V_2$; the potential of the wiring 114 is kept at $V_2$; and the potential of the wiring 115 is at $V_1$. Thus, the transistor 104 is kept off, so that electrical continuity between the wiring 114 and the node 11 remains unestablished. The transistor 105 is turned on, so that electrical continuity between the wiring 113 and the node 11 is established. Thus, the potential of the wiring 113 is supplied to the node 11, so that the potential of the node 11 is at $V_2$. Thus, the transistor 101 is turned off, so that electrical continuity between the wiring 111 and the wiring 112 is not established. At this time, the circuit 200 sets the potential of the node 12 at $V_1$. Thus, the transistor 102 is turned on, so that electrical continuity between the wiring 113 and the wiring 112 is established. The transistor 103 is turned on, so that electrical continuity between the wiring 113 and the node 11 is established. Thus, the potential of the wiring 113 is supplied to the wiring 112, so that the potential of the wiring 112 is at $V_2$ (see FIG. 4A).

Figure 4B:
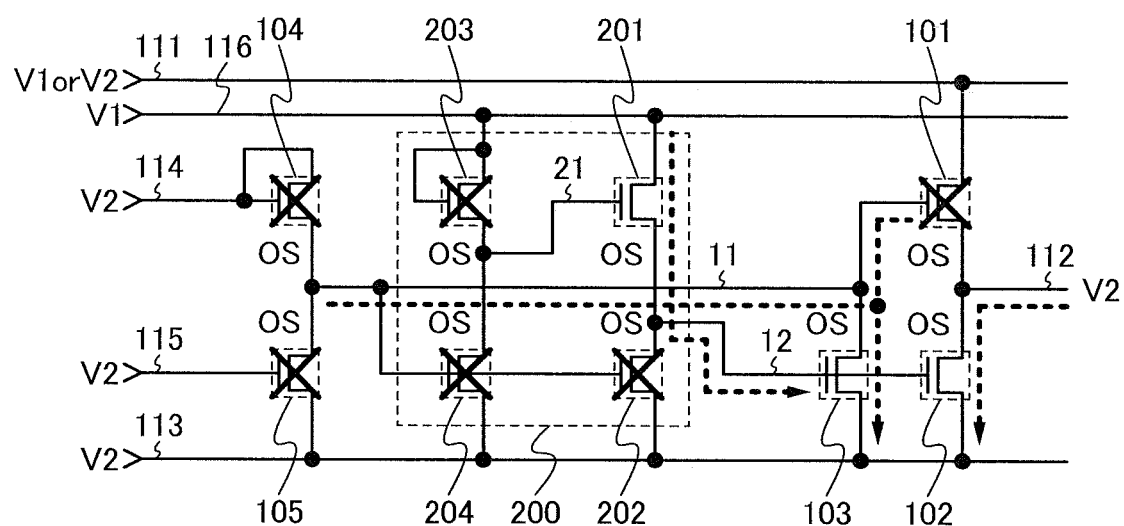

In the period D, the potential of the wiring 111 is repeatedly at $V_1$ and $V_2$ in turn; the potential of the wiring 114 is kept at $V_2$; and the potential of the wiring 115 is at $V_2$. Thus, the transistor 104 is kept off, so that electrical continuity between the wiring 114 and the node 11 remains unestablished. The transistor 105 is turned off, so that electrical continuity between the wiring 113 and the node 11 is not established. At this time, the circuit 200 continuously sets the potential of the node 12 at $V_1$. Thus, the transistor 102 is kept on, so that electrical continuity between the wiring 113 and the wiring 112 remains established. The transistor 103 is kept on, so that electrical continuity between the wiring 113 and the node 11 remains established. Thus, the potential of the wiring 113 is continuously supplied to the node 11, so that the potential of the node 11 is kept at $V_2$. Thus, the transistor 101 is kept off, so that electrical continuity between the wiring 111 and the wiring 112 remains unestablished. Thus, the potential of the wiring 113 is continuously supplied to the wiring 112, so that the potential of the wiring 112 is kept at $V_2$ (see FIG. 4B).

Next, the operation of the circuit 200 is specifically described. For example, the potential of the node 11 is higher than or equal to $V_2+V_{th202}$ ($V_{th202}$ represents the threshold voltage of the transistor 202) and higher than or equal to $V_2+V_{th204}$ ($V_{th204}$ represents the threshold voltage of the transistor 204). Thus, the transistor 202 is turned on, so that electrical continuity between the wiring 113 and the node 12 is established. The transistor 204 is turned on, so that electrical continuity between the wiring 113 and the node 21 is established. At this time, the transistor 203 is turned on, so that electrical continuity between the wiring 116 and the node 21 is established. Thus, the potential of the wiring 116 and the potential of the wiring 113 are supplied to the node 21, so that the potential of the node 21 (potential $V_{21}$) is higher than $V_2$ and lower than $V_1$. The potential of the node 21 is determined by the current supply capability (e.g., channel length, channel width, and mobility) of the transistor 203 and the current supply capability of the transistor 204. Here, the potential of the node 21 is lower than $V_2+V_{th201}$ ($V_{th201}$ represents the threshold voltage of the transistor 201). Thus, the transistor 201 is turned off, so that electrical continuity between the wiring 116 and the node 12 is not established. Thus, the potential of the wiring 113 is supplied to the node 12, so that the potential of the node 12 is at $V_2$ (for example, in the period A and the period B).

In contrast, for example, the potential of the node 11 is lower than $V_2+V_{th202}$ and lower than $V_2+V_{th204}$. Thus, the transistor 202 is turned off, so that electrical continuity between the wiring 113 and the node 12 is not established. The transistor 204 is turned off, so that electrical continuity between the wiring 113 and the node 21 is not established. At this time, the transistor 203 is turned on, so that electrical continuity between the wiring 116 and the node 21 is established. Thus, the potential of the wiring 116 is supplied to the node 21, so that the potential of the node 21 rises. Finally, the potential of the node 21 is at $V_1+V_{th201}+V_b$ ($V_b$ is a positive potential). Thus, the transistor 201 is turned on, so that electrical continuity between the wiring 116 and the node 12 is established. Thus, the potential of the wiring 116 is supplied to the node 12, so that the potential of the node 12 is at $V_1$ (for example, in the period C and the period D).

As described above, in the circuits illustrated in FIGS. 1A and 1B, the potential of the wiring 112 can be made equal to the potential of the wiring 111 by the bootstrap operation. Further, in the period B, a potential difference between the gate and the source of the transistor 101 ($V_{gs}$) can be increased, so that the rise time of V112 can be shortened.

Note that in a conventional semiconductor device, the subthreshold swing of a transistor is large. Thus, it takes a longer time from when the potential of the wiring 114 is at $V_1$ until when the transistor 104 is turned on. Further, the problems of the conventional semiconductor device are as follows. The length of the period A needs to be made longer; thus, it is difficult to raise drive frequency. The rise time of V112 is long (the rise time of an output signal is long). A load which can be connected to the wiring 112 is decreased. The channel width of the transistor 101 is increased. The layout area is increased.

In contrast, in this embodiment, the subthreshold swing of a transistor is small. Thus, drive capability can be improved. For example, when the subthreshold swing of the transistor 104 is small, it is possible to shorten the time from when the potential of the wiring 114 is at $V_j$ until when the transistor 104 is turned on. Thus, the length of the period A can be shortened. Accordingly, drive frequency can be improved. As another example, when the subthreshold swing of the transistor 104 is small, it is possible to shorten the rise time of the potential of the wiring 112. In addition, even when a large load is connected to the wiring 112, the load can be driven. Further, the channel width of the transistor 101 can be decreased; thus, the layout area can be decreased.

Note that in the conventional semiconductor device, the off-state current of the transistor is high. Thus, the amount of electrical charges that are lost from the node 11 as time passes is large. Further, the problems of the conventional semiconductor device are as follows. The potential of the node 11 is decreased. The time during which the potential of the node 11 can be kept higher than a potential at which the transistor 101 is turned on is short. It is difficult to lower drive frequency. The range of drive frequency at which the semiconductor device can operate is narrowed.

In contrast, in this embodiment, the off-state current of the transistor is low. Thus, drive capability can be improved. For example, when the off-state current of the transistor 103, the transistor 104, and the transistor 105 is low, the amount of electrical charges that are lost from the node 11 can be decreased. Thus, the decrease in the potential of the node 11 can be suppressed. That is, the time during which the potential of the node 11 can be kept higher than the potential at which the transistor 101 is turned on can be extended.

Accordingly, the drive frequency can be lowered; thus, the range of drive frequency at which the semiconductor device can operate can be broadened.

Note that in the conventional semiconductor device, the transistor easily deteriorates and the amount of shifts in the threshold voltage of the transistor is large. Thus, the transistor is driven so as to be repeatedly turned on and off. Further, the problems of the conventional semiconductor device are as follows. Two transistors are connected in parallel and are alternately turned on. A circuit for controlling the on-off of the transistors is complicated. The number of transistors is increased. In order to suppress deterioration of the transistors, it is necessary to make the channel widths of the transistors large. Further, in order to suppress deterioration of the transistors, it is necessary to make the channel lengths of the transistors long. The layout area is increased.

In contrast, in this embodiment, the amount of shifts in the threshold voltage of the transistor is small. Thus, drive capability can be improved. For example, when the amount of shifts in the threshold voltage of the transistor 102 and the transistor 103 is small, the time during which these transistors are on can be extended. Therefore, a circuit for controlling the on-off of the transistor 102 and the transistor 103 can be simplified. Accordingly, the number of transistors can be decreased; thus, the layout area can be decreased. Further, when the amount of shifts in the threshold voltage of the transistor 102 and the transistor 103 is small, the channel widths or channel lengths of these transistors can be decreased. Thus, the layout area can be decreased. Further, when the amount of shins in the threshold voltage of the transistors is small, the time during which the semiconductor device can operate can be extended.

The circuit in the display device which is one embodiment of the present invention is not limited to the circuits in FIGS. 1A and 1B. Circuits with a variety of structures can be used. Examples of circuits are described below.

Figure 5A:
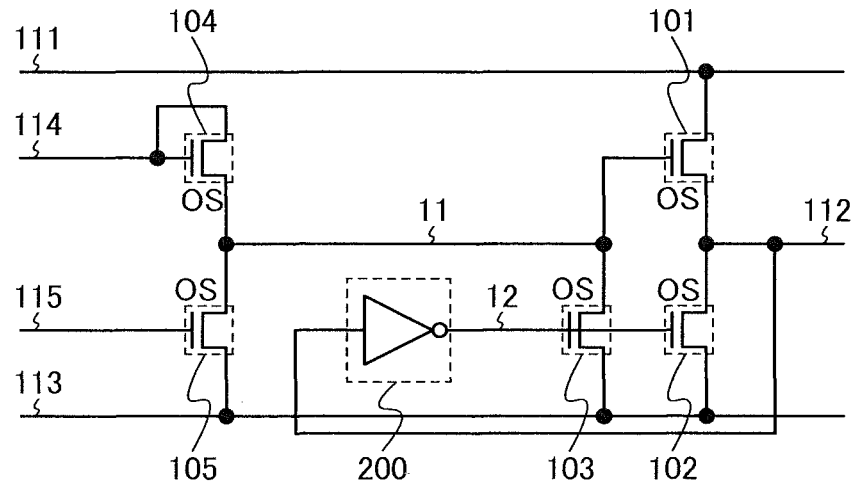
FIGS. 5A to 5C illustrate structures of circuits in Embodiment 1.

For example, in the circuits illustrated in FIGS. 1A and 1B, the input terminal of the circuit 200 can be connected to the wiring 112, as illustrated in FIG. 5A. Specifically, the gate of the transistor 202 and the gate of the transistor 204 can be connected to the wiring 112. Note that FIG. 5A illustrates the case where the input terminal of the circuit 200 is connected to the wiring 112 in the circuit illustrated in FIG. 1A.

Figure 5B:
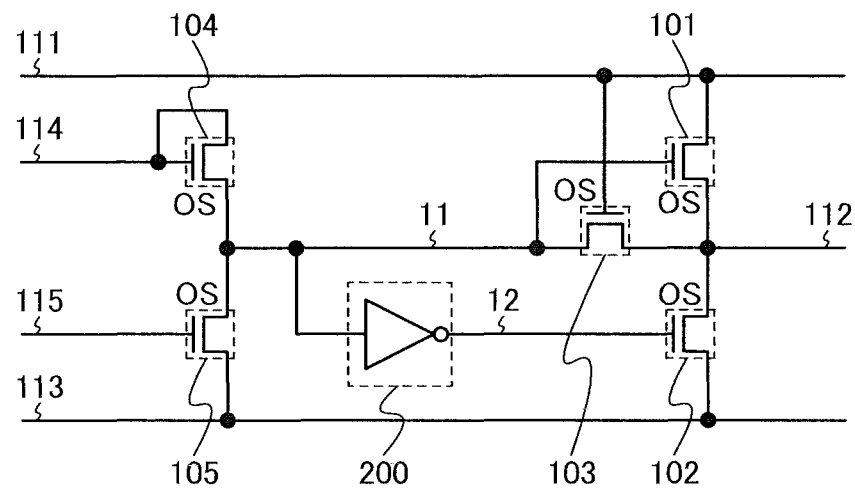

As another example, in the circuits illustrated in FIGS. 1A and 1B and FIG. 5A, the first terminal of the transistor 103 can be connected to the wiring 112 and the gate of the transistor 103 can be connected to the wiring 111, as illustrated in FIG. 5B. Thus, the time during which the transistor 103 is on can be shortened, so that deterioration of the transistor 103 can be suppressed. Further, in the period B, the potential of the node 11 can be prevented from being too high. Accordingly, a transistor electrically connected to the node 11 (e.g., the transistor 101, the transistor 104, the transistor 105, or the transistor included in the circuit 200) can be prevented from being damaged or deteriorating, for example. Note that FIG. 5B illustrates the case where the first terminal of the transistor 103 is connected to the wiring 112 and the gate of the transistor 103 is connected to the wiring 111 in the circuit illustrated in FIG. 1A.

Figure 5C:
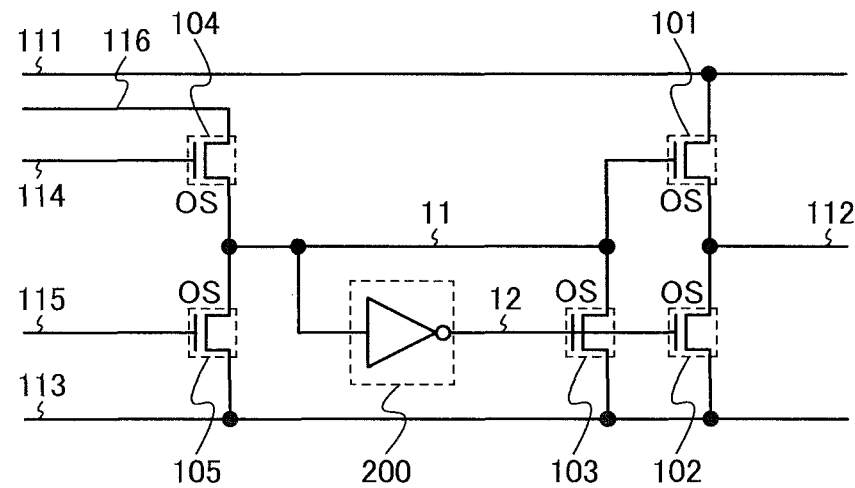

As another example, in the circuits illustrated in FIGS. 1A and 1B and FIGS. 5A and 5B, the first terminal of the transistor 104 can be connected to the wiring 116, as illustrated in FIG. 5C. Note that FIG. 5C illustrates the case where the first terminal of the transistor 104 is connected to the wiring 116 in the circuit illustrated in FIG. 1A.

A variety of elements such as transistors and capacitors can be provided in the circuits illustrated in FIGS. 1A and 1B and FIGS. 5A to 5C. Examples of circuits are described below.

Figure 6A:
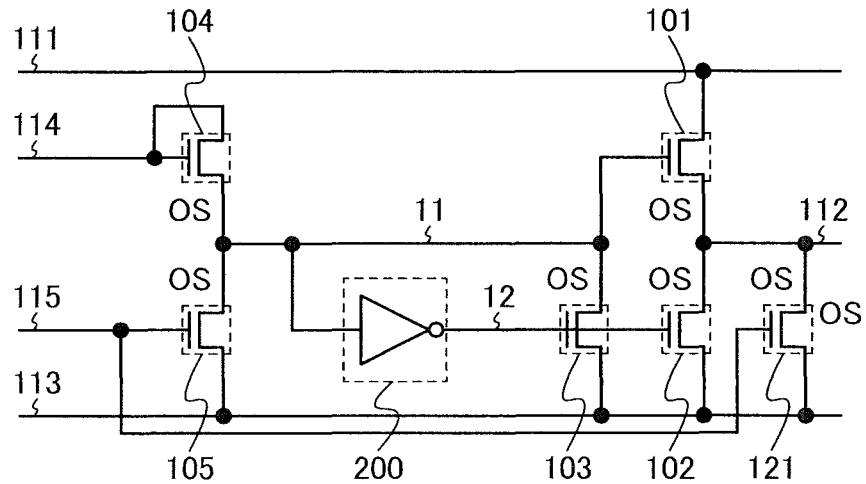
FIGS. 6A to 6C illustrate structures of circuits in Embodiment 1.

For example, in the circuits illustrated in FIGS. 1A and 1B and FIGS. 5A to 5C, a transistor 121 can be provided, as illustrated in FIG. 6A. A first terminal of the transistor 121 is connected to the wiring 113; a second terminal of the transistor 121 is connected to the wiring 112; and a gate of the transistor 121 is connected to the wiring 115. In the period C, the transistor 121 is turned on, so that the potential of the wiring 113 is supplied to the wiring 112. Thus, the fall time of V112 can be shortened. Note that FIG. 6A illustrates the case where the transistor 121 is provided in the circuit illustrated in FIG. 1A.

Figure 6B:
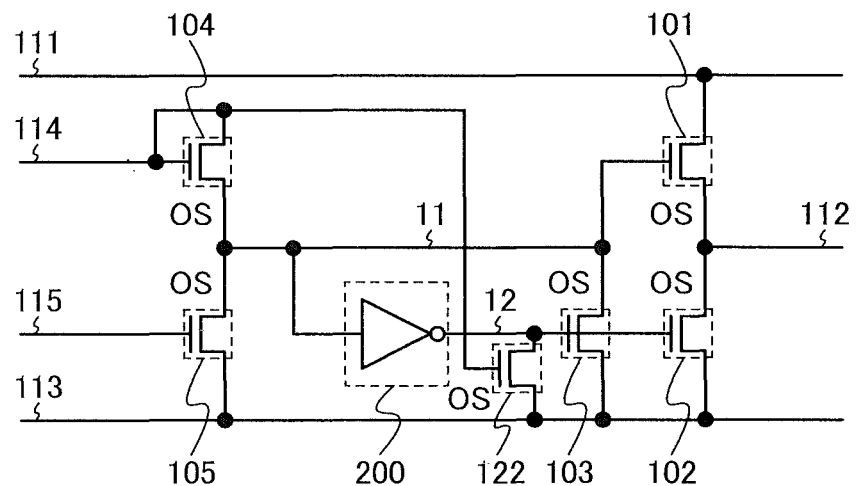

As another example, in the circuits illustrated in FIGS. 1A and 1B, FIGS. 5A to 5C, and FIG. 6A, a transistor 122 can be provided, as illustrated in FIG. 6B. A first terminal of the transistor 122 is connected to the wiring 113; a second terminal of the transistor 122 is connected to the node 12; and a gate of the transistor 122 is connected to the wiring 114. In the period A, the transistor 122 is turned on, so that the potential of the wiring 113 is supplied to the node 12. Thus, the fall time of V12 can be shortened, so that timing of turning off the transistor 103 can be earlier. Accordingly, timing of when the potential of the node 11 reaches $V_1 - V_{th104}$ can be earlier; thus, the length of the period A can be shortened. Therefore, drive frequency can be raised. Note that FIG. 6B illustrates the case where the transistor 122 is provided in the circuit illustrated in FIG. 1A.

Figure 6C:
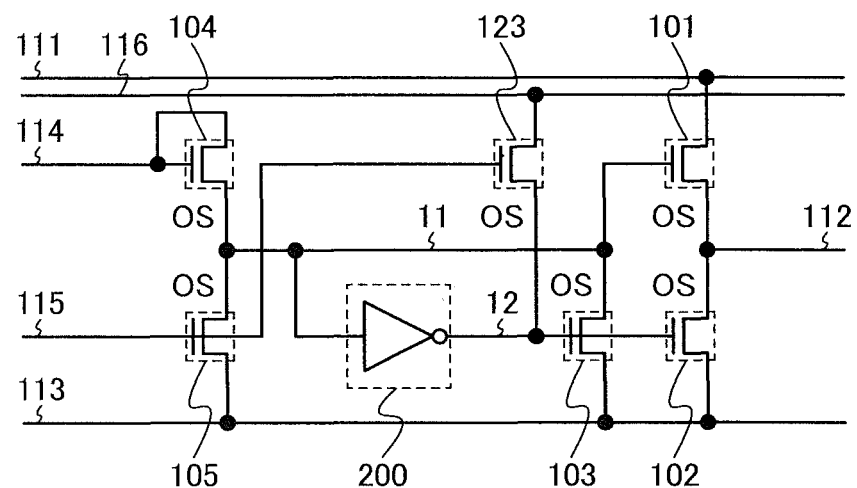

As another example, in the circuits illustrated in FIGS. 1A and 1B, FIGS. 5A to 5C, and FIGS. 6A and 6B, a transistor 123 can be provided, as illustrated in FIG. 6C. A first terminal of the transistor 123 is connected to the wiring 116; a second terminal of the transistor 123 is connected to the node 12; and a gate of the transistor 123 is connected to the wiring 115. In the period C, the transistor 123 is turned on, so that the potential of the wiring 116 is supplied to the node 12. Thus, in the period C, the fall time of V12 can be shortened. Therefore, timing of turning on the transistor 102 and the transistor 103 can be earlier. Accordingly, timing of supplying the potential of the wiring 113 to the wiring 112 can be earlier; thus, the fall time of the potential of the wiring 112 can be shortened. Note that FIG. 6C illustrates the case where the transistor 123 is provided in the circuit illustrated in FIG. 1A.

Figure 7A:
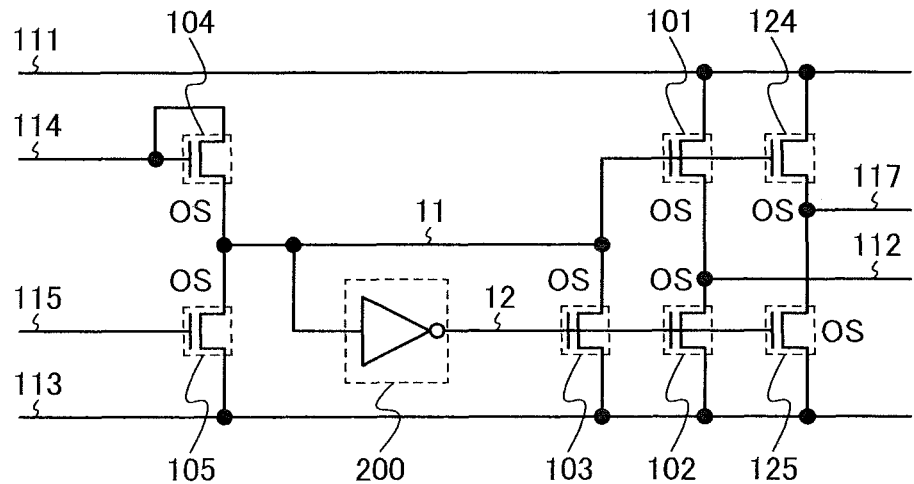
FIGS. 7A and 7B illustrate structures of circuits in Embodiment 1.

As another example, in the circuits illustrated in FIGS. 1A and 1B, FIGS. 5A to 5C, and FIGS. 6A to 6C, a transistor 124 and a transistor 125 can be provided, as illustrated in FIG. 7A. A first terminal of the transistor 124 is connected to the wiring 111; a second terminal of the transistor 124 is connected to a wiring 117; and a gate of the transistor 124 is connected to the node 11. A first terminal of the transistor 125 is connected to the wiring 113; a second terminal of the transistor 125 is connected to the wiring 117; and a gate of the transistor 125 is connected to the node 12. Thus, the potential of the wiring 117 and the potential of the wiring 112 can be changed at the same timing. For example, it is preferable that one of the wiring 112 and the wiring 117 be connected to a load and the other of the wiring 112 and the wiring 117 be connected to a different circuit. Note that it is possible not to provide the transistor 125. Note that FIG. 7A illustrates the case where the transistor 124 and the transistor 125 are provided in the circuit illustrated in FIG. 1A.

Figure 7B:
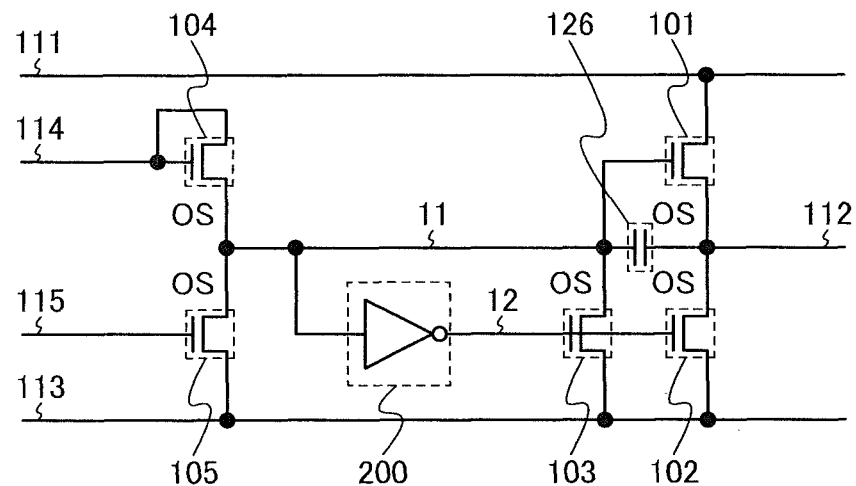

As another example, in the circuits illustrated in FIGS. 1A and 1B, FIGS. 5A to 5C, FIGS. 6A to 6C, and FIG. 7A, a capacitor 126 can be provided between the gate and the second terminal of the transistor 101, as illustrated in FIG. 7B. Note that the capacitor 126 can be provided between the gate and the second terminal of the transistor 124. Note that FIG. 7B illustrates the case where the capacitor 126 is provided in the circuit illustrated in FIG. 1A.

Figure 8A:
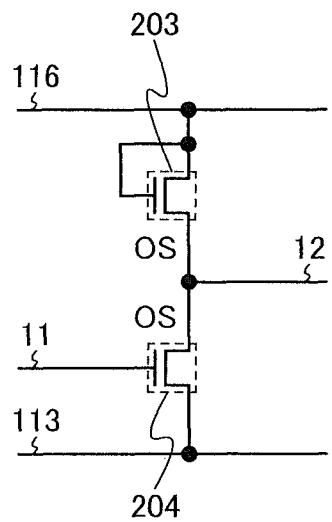
FIGS. 8A to 8C illustrate structures of circuits in Embodiment 1.
Figure 8B:
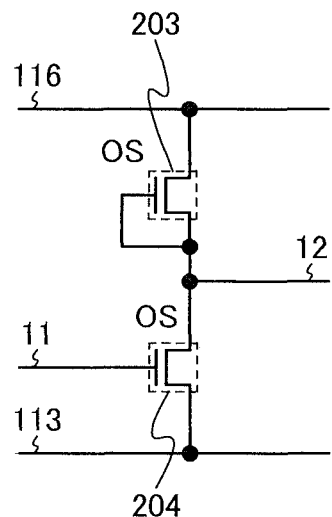
Figure 8C:
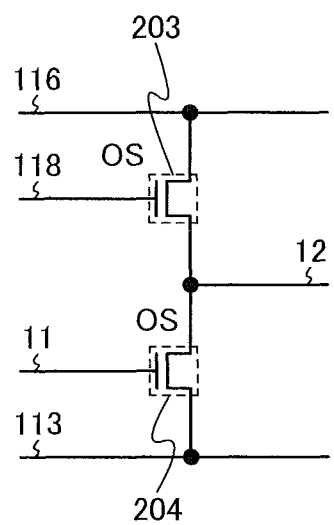

The structure of the circuit 200 is not limited to the structure illustrated in FIG. 1B. A variety of different structures can be employed. Examples of different structures are described. For example, as illustrated in FIG. 8A, it is possible not to provide the transistor 201 and the transistor 202. Note that in the circuit 200 illustrated in FIG. 8A, the gate of the transistor 203 can be connected to the node 12, as illustrated in FIG. 8B. Further, in the circuit 200 illustrated in FIG. 8A, the gate of the transistor 203 can be connected to a wiring 118, as illustrated in FIG. 8C. A signal obtained by inversion of a signal input to the wiring 111 (such a signal is referred to as an inversion clock signal) or a signal that is out of phase with the signal input to the wiring 111 (e.g., a signal that is out of phase with the signal input to the wiring 111 by 180°, 90°, or 45°) is input to the wiring 118. Thus, the wiring 118 functions as a signal line, a clock signal line, or an inversion clock signal line. Note that the structure of the circuit 200 is not limited to the above structure as long as the functions of the circuit 200 can be realized.

Figure 2A:
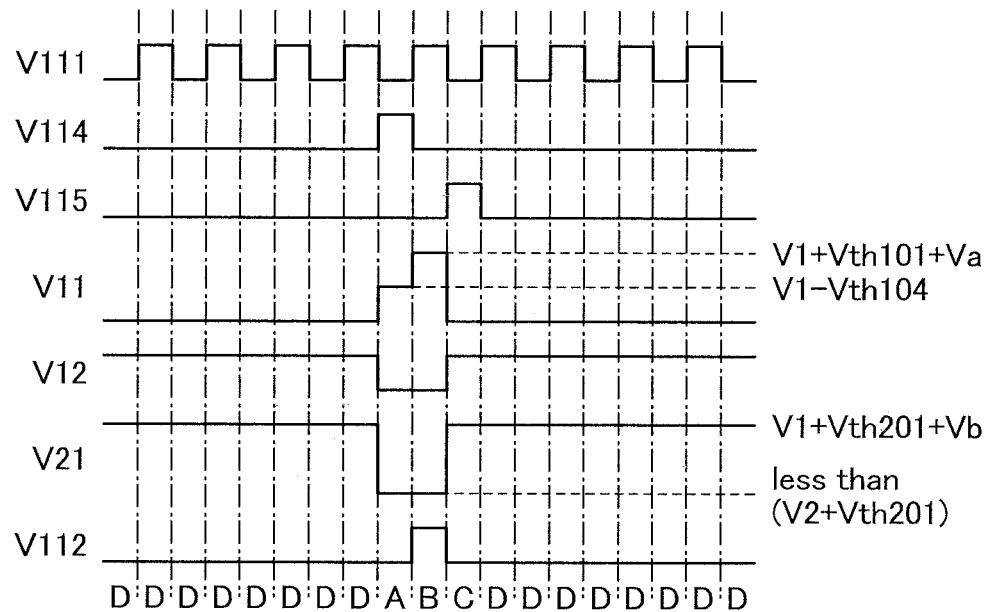
FIG. 2A is a timing chart for illustrating operation of the circuit in Embodiment 1.
Figure 2B:
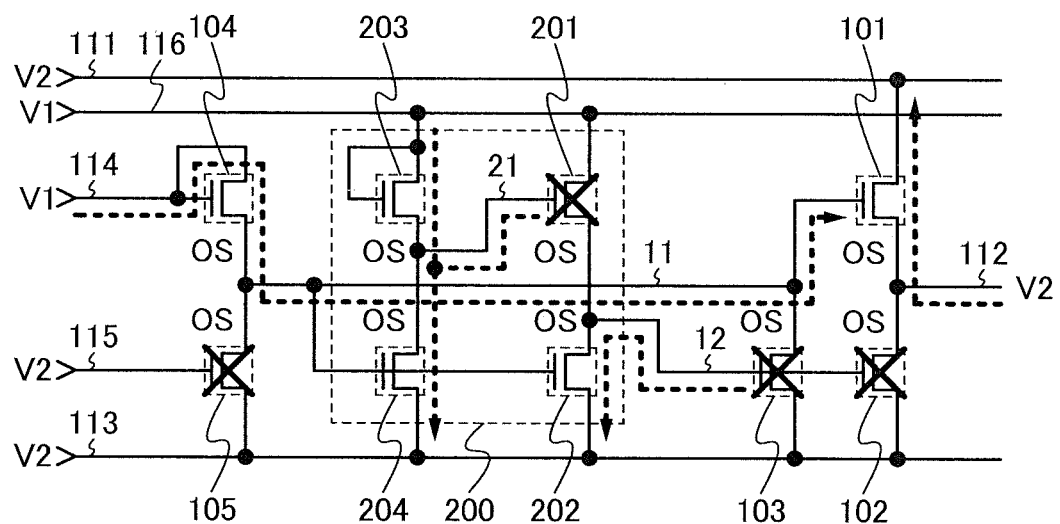
FIG. 2B is a schematic view for illustrating operation of the circuit in Embodiment 1.
Figure 9A:
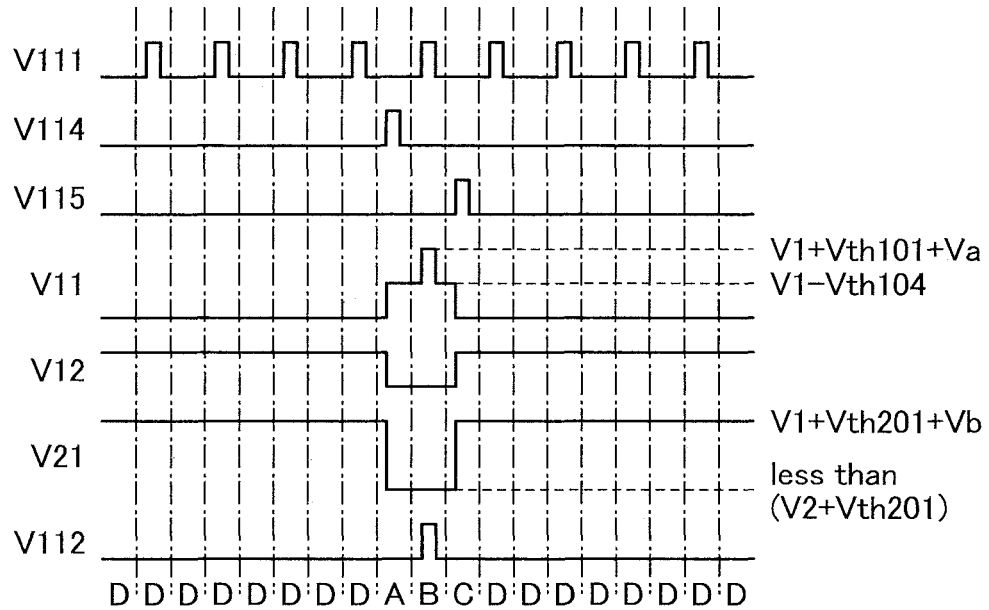
FIGS. 9A and 9B are timing charts for illustrating operation of the circuit in Embodiment 1.
Figure 9B:
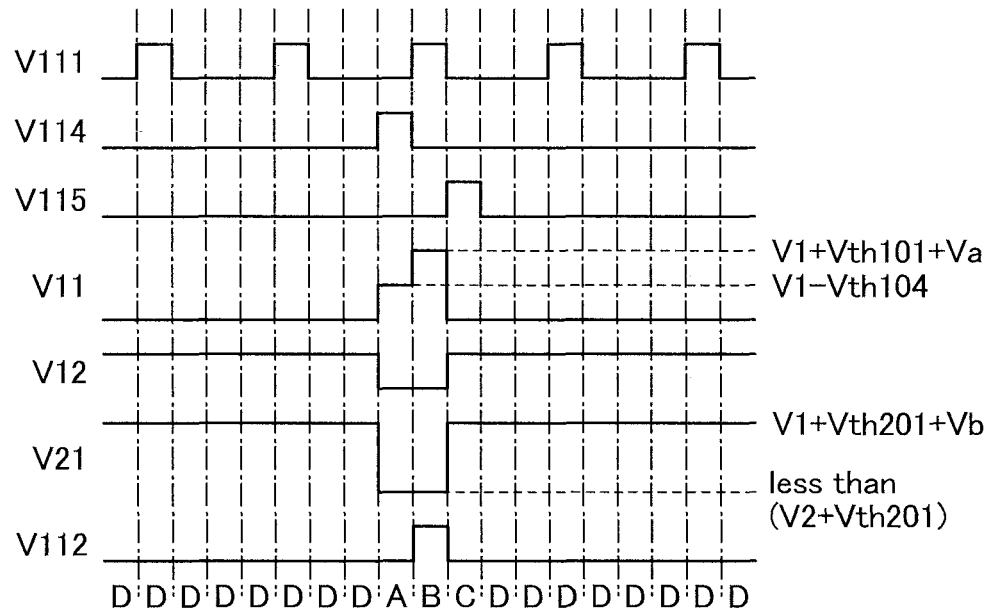

The timing chart of the circuit is not limited to the timing chart illustrated in FIG. 2A. A variety of timing charts can be used. Examples of timing charts are described. For example, a signal input to the wiring 111 can be non-balanced, as illustrated in FIG. 9A. Thus, in the period C, timing of when the potential of the wiring 115 becomes $V_1$ can be later than timing of when the potential of the wiring 111 becomes $V_2$. Accordingly, the fall time of V112 can be shortened. As another example, a signal input to the wiring 111 can be a multiphase clock signal, as illustrated in FIG. 9B. Thus, power consumption can be reduced. Note that FIG. 9B is an example of a timing chart when a four-phase clock signal is input to the wiring 111.

The W/L (W: channel width and L: channel length) ratio of the transistor 101 is preferably higher than the W/L ratios of the transistor 102, the transistor 103, the transistor 104, and the transistor 105. Specifically, the W/L ratio of the transistor 101 is preferably 1.5 to 10 times the W/L ratio of the transistor 104. More preferably, the W/L ratio of the transistor 101 is 1.8 to 7 times the W/L ratio of the transistor 104. Still more preferably, the W/L ratio of the transistor 101 is 2 to 4 times the W/L ratio of the transistor 104. Further, the W/L ratio of the transistor 102 is preferably higher than the W/L ratio of the transistor 103 because a load of the transistor 103 (e.g., the node 11) is smaller than a load of the transistor 102 (e.g., the wiring 112). Specifically, the W/L ratio of the transistor 102 is preferably 1.5 to 8 times the W/L ratio of the transistor 103. More preferably, the W/L ratio of the transistor 102 is 2 to 6 times the W/L ratio of the transistor 103. Still more preferably, the W/L ratio of the transistor 102 is 2 to 5 times the W/L ratio of the transistor 103. Furthermore, at least one of the channel length of the transistor 102 and the channel length of the transistor 103 is preferably longer than the channel length of the transistor 105. Specifically, at least one of the channel length of the transistor 102 and the channel length of the transistor 103 is preferably 1 to 4 times the channel length of the transistor 105. More preferably, at least one of the channel length of the transistor 102 and the channel length of the transistor 103 is 1.3 to 3 times the channel length of the transistor 105. Still more preferably, at least one of the channel length of the transistor 102 and the channel length of the transistor 103 is 1.8 to 2.5 times the channel length of the transistor 105.

The width of the wiring 111 is preferably smaller than at least one of the channel width of the transistor 101, the channel width of the transistor 102, and the channel width of the transistor 104. Further, the width of the wiring 111 is preferably larger than at least one of the widths of the wiring 116.

Figure 10A:
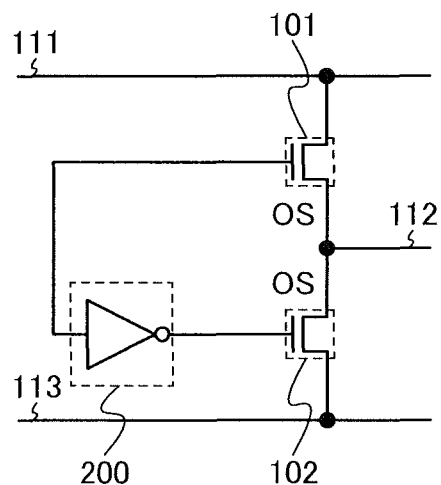
FIGS. 10A to 10D illustrate structures of circuits in Embodiment 1.
Figure 10B:
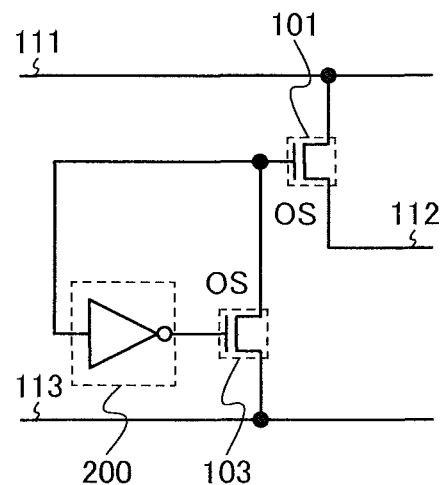
Figure 10C:
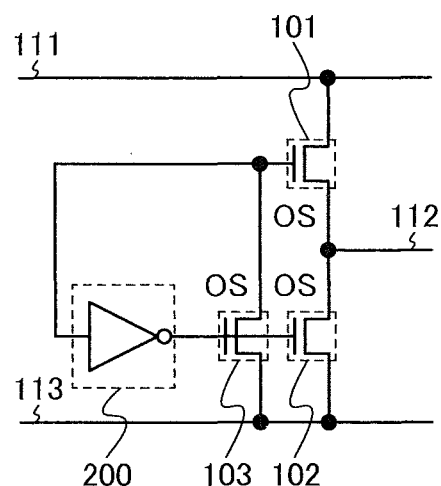
Figure 10D:
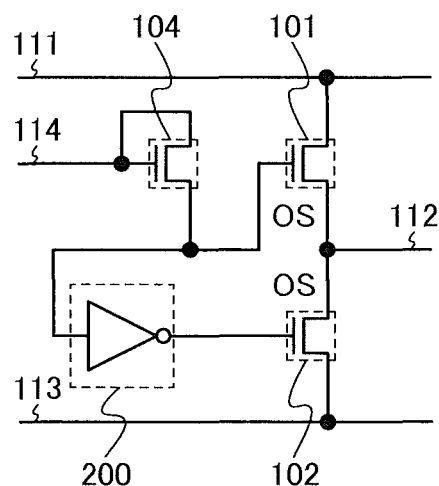

Of the circuits described in this embodiment, each of the following structures is included as one embodiment of the present invention: a semiconductor device including the transistor 101, the transistor 102, and the circuit 200 (see FIG. 10A); a semiconductor device including the transistor 101, the transistor 103, and the circuit 200 (see FIG. 10B); a semiconductor device including the transistor 101, the transistor 102, the transistor 103, and the circuit 200 (see FIG. 10C); and a semiconductor device including the transistor 101, the transistor 102, the transistor 104, and the circuit 200 (see FIG. 10D).

Embodiment 2

In this embodiment, a shift register circuit in a display device which is one embodiment of the present invention is described. A shift register circuit in this embodiment can include any of the circuits described in Embodiment 1. Further, the shift register circuit in this embodiment can be used as a driver circuit of a display device, such as a gate driver circuit and/or a source driver circuit.

Figure 11:
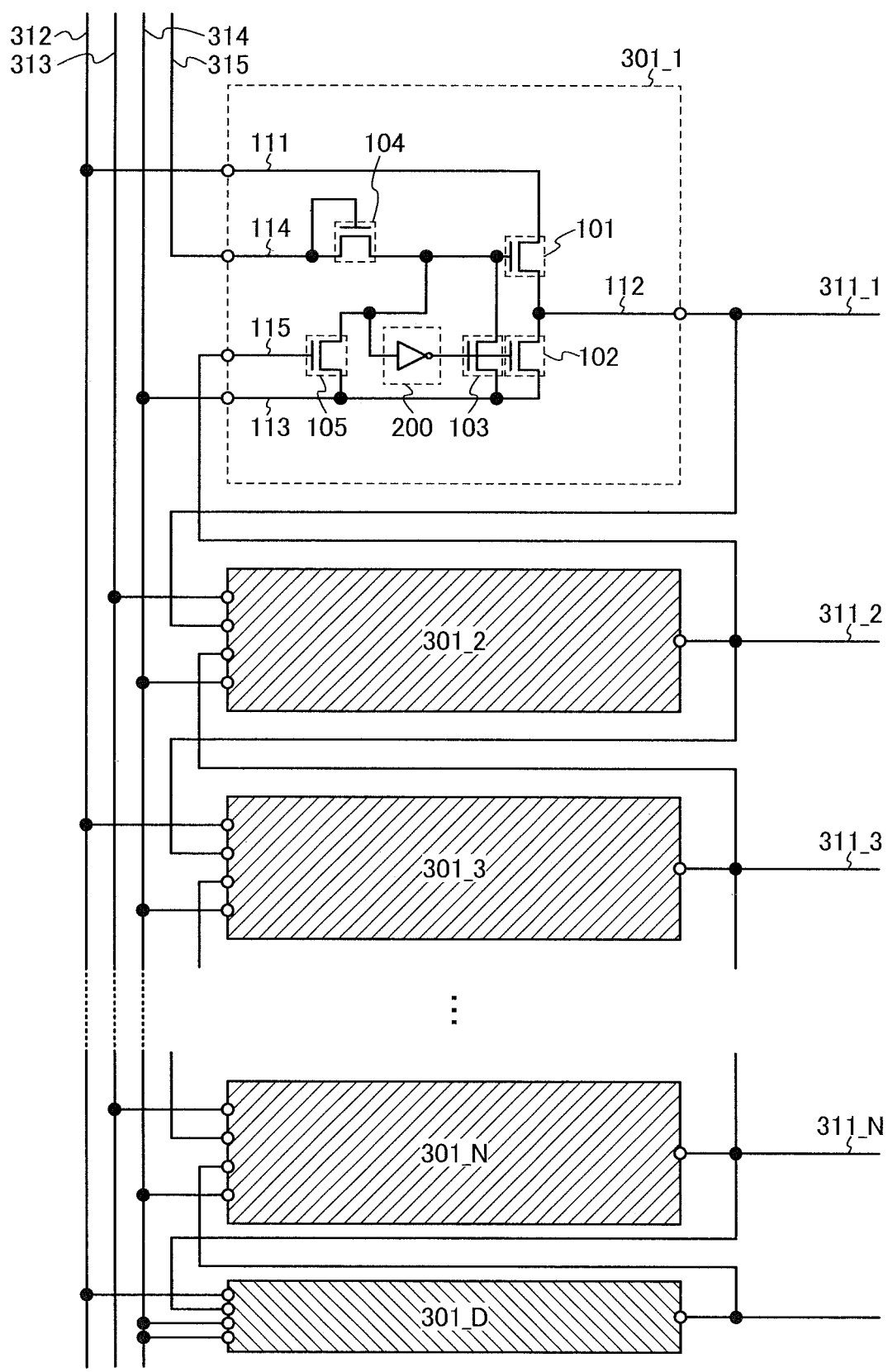
FIG. 11 illustrates a structure of a shift register circuit in Embodiment 2.

FIG. 11 illustrates a structure example of a shift register circuit which includes N(N is a natural number) pieces of circuits 301 (circuits 301_1 to 301_N). Any of the circuits described in Embodiment 1 can be used as the circuit 301. FIG. 11 illustrates an example in which the circuit illustrated in FIG. 1A is used as the circuit 301.

Connection relations in the shift register circuit illustrated in FIG. 11 are described. The connection relation in a circuit 301_i (i is a natural number that is 2 or more and less than N−1) is described as an example. The circuit 301_i is connected to a wiring 311_i, a wiring 311_i−1, a wiring 311_i+1, one of a wiring 312 and a wiring 313, and a wiring 314. Specifically, in the circuit 301_i, the wiring 112 is connected to the wiring 311_i; the wiring 114 is connected to the wiring 311_i−1; the wiring 115 is connected to the wiring 311_i+1; the wiring 111 is connected to one of the wiring 312 and the wiring 313; and the wiring 113 is connected to the wiring 314. Note that in the case where the wiring 111 is connected to the wiring 312 in the circuit 301_i, the wiring 111 is connected to the wiring 313 in a circuit 301_i+1 and a circuit 301_i−1. The circuit 301_1 differs from the circuit 301_i in that the wiring 114 is connected to a wiring 315. The circuit 301_N differs from the circuit 301_i in that the wiring 115 is connected to an output terminal of a dummy circuit (a circuit 301_D). Note that a structure which is similar to the structure of the circuit 301 or part of the structure of the circuit 301 can be used as the structure of the circuit 301_D.

Figure 12:
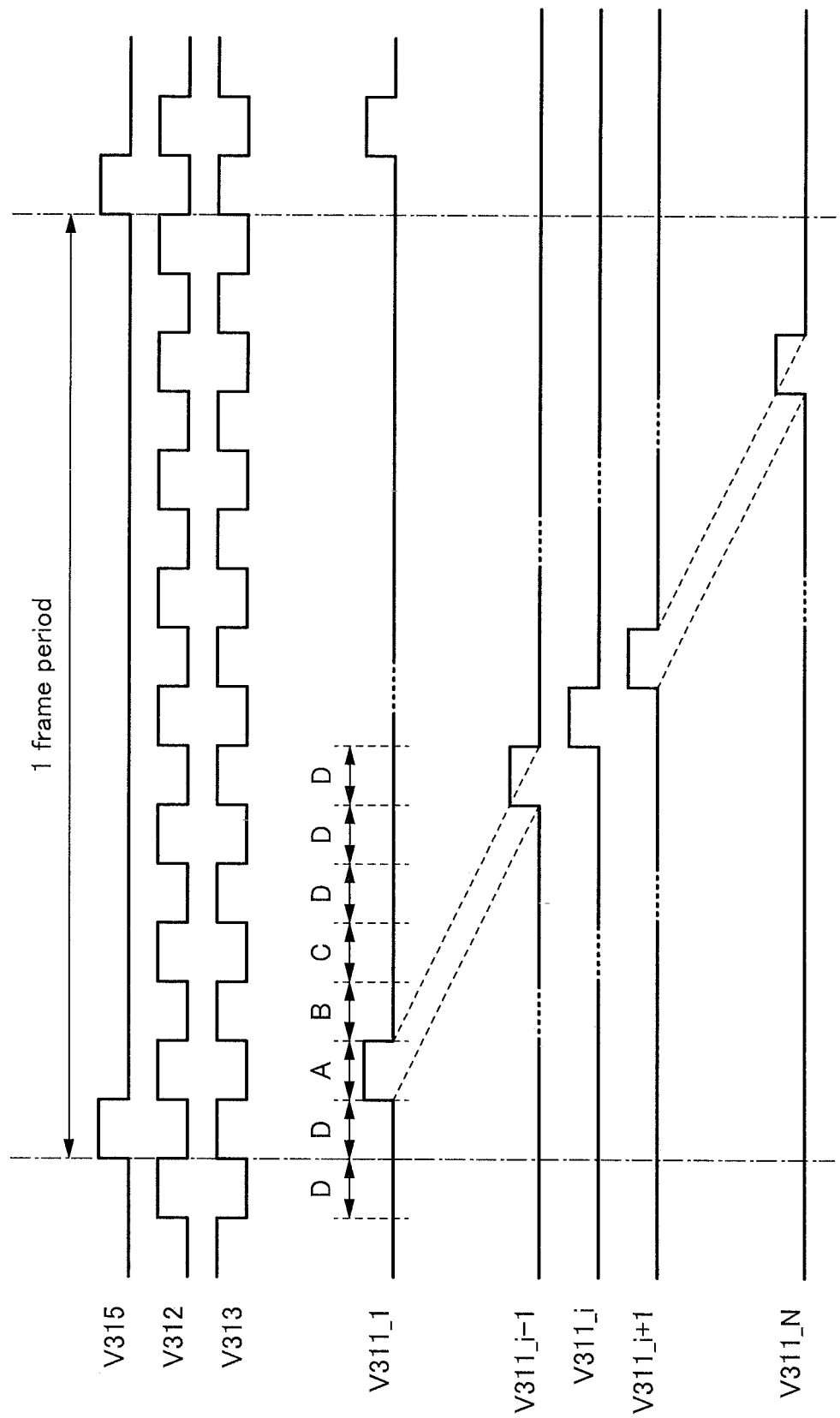
FIG. 12 is a timing chart for illustrating operation of the shift register circuit in Embodiment 2.

The operation of the shift register circuit illustrated in FIG. 11 is described with reference to a timing chart in FIG. 12.

The operation of the circuit 301_i is described as an example. First, the potential of the wiring 311_i−1 (potential $V_{311\_i-1}$) is at $V_1$. Then, the circuit 301_i performs the operation in the period A described in Embodiment 1, so that the potential of the wiring 311_i (potential $V_{311\_i}$) is at $V_2$. After that, the potential of the wiring 312 (potential $V_{312}$) and the potential of the wiring 313 (potential $V_{313}$) are inverted. Then, the circuit 301_i performs the operation in the period B described in Embodiment 1, so that the potential of the wiring 311_i is at $V_1$. After that, the potential of the wiring 312 and the potential of the wiring 313 are inverted, so that the potential of the wiring 311_i+1 (potential $V_{311\_i+1}$) is at $V_1$. Then, the circuit 301_i performs the operation in the period C described in Embodiment 1, so that the potential of the wiring 311_i is at $V_2$. After that, the circuit 301_i performs the operation in the period D described in Embodiment 1 until the potential of the wiring 311_i−1 is at $V_1$ again, so that the potential of the wiring 311_i is kept at $V_2$. Note that that the circuit 301_1 differs from the circuit 301_i in that it performs the operation in the period A when the potential of the wiring 315 (potential $V_{315}$) is at $V_1$. Further, the circuit 301_N differs from the circuit 301_i in that it performs the operation in the period C when an output signal of the circuit 301_D is at $V_1$.

As described above, the potentials of the wirings 311_1 to 311_N (potentials $V_{311\_1}$ to $V_{311\_S}$) can be sequentially at $V_1$. When the circuit described in Embodiment is used in the shift register circuit illustrated in FIG. 11, the shift register circuit can have advantages which are similar to those of the circuit described in Embodiment 1.

An output signal of the shift register circuit is input to a wiring 311 (one of the wirings 311_1 to 311_N. A clock signal is input to the wiring 312. A clock signal that is out of phase with the clock signal input to the wiring 312 or a signal obtained by inversion of the clock signal input to the wiring 312 is input to the wiring 313. The voltage $V_2$ is supplied to the wiring 314. A start signal is input to the wiring 315.

The wiring 311 is used for transmitting an output signal of the shift register circuit to a circuit such as a pixel circuit or a demultiplexer. The wiring 311 functions as a signal line or a gate signal line. Each of the wiring 312 and the wiring 313 is used for transmitting a signal such as a clock signal from an external circuit such as a controller to the shift register circuit in this embodiment. Each of the wiring 312 and the wiring 313 functions as a signal line or a clock signal line. The wiring 314 is used for supplying power supply voltage such as the voltage $V_2$ from an external circuit such as a power supply circuit to the shift register circuit in this embodiment. The wiring 314 functions as a power supply line, a negative power supply line, or a ground line. The wiring 315 is used for transmitting a start signal from an external circuit such as a controller to the shift register circuit in this embodiment. The wiring 315 functions as a signal line.

Embodiment 3

In this embodiment, an example of a transistor included in the circuit described in Embodiment 1 or 2 is described. Specifically, examples of the structure of a transistor whose channel region includes an oxide semiconductor and manufacturing steps thereof are described.

As the oxide semiconductor, the following oxides can be used: an In—Sn—Ga—Zn—O-based oxide semiconductor that is an oxide of four metal elements, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an A-Ga—Zn—O-based oxide semiconductor, or a Sn—Al—Zn—O-based oxide semiconductor that is an oxide of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor that is an oxide of two metal elements; an In—O-based oxide semiconductor; a Sn—O-based oxide semiconductor; a Zn—O-based oxide semiconductor; and the like. Further, $SiO_2$ may be contained in the oxide semiconductor.

For the oxide semiconductor, a substance represented by $InMO_3(ZnO)_m$ (m>0, where m is not a natural number) can be used. Here, M denotes one or more metal elements selected from Ga, Al, Mn, or Co. For example, M can be Ga, Ga and Al, Ga and Mn, Ga and Co, or the like. Among oxide semiconductor semiconductors whose composition formulae are expressed by $InMO_3(ZnO)_m$ (m>0, where m is not a natural number), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based film. In addition, an oxide semiconductor material expressed by In—Ga—Zn—O in this specification is $InGaO_3(ZnO)_m$ (m>0, where m is not a natural number), and it can be confirmed by analysis using ICP-MS or RBS that m is not a natural number.

An example of a method for manufacturing a transistor whose channel region includes an oxide semiconductor is described with reference to FIGS. 13A to 13D.

FIGS. 13A to 13D illustrate an example of the cross-sectional structure of a transistor. A transistor 410 illustrated in FIG. 13D has a kind of bottom-gate structure called a channel-etched structure.

Figure 13A:
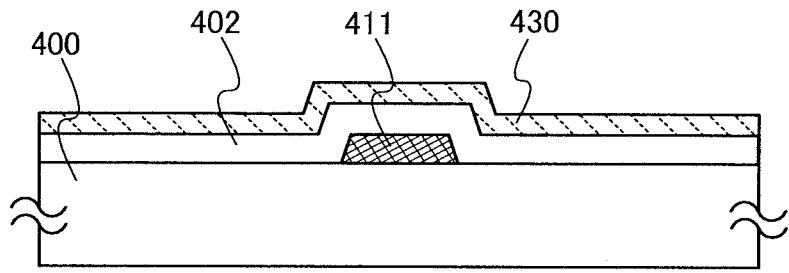
FIGS. 13A to 13D are examples of diagrams for illustrating steps of manufacturing a transistor in Embodiment 3.
Figure 13B:
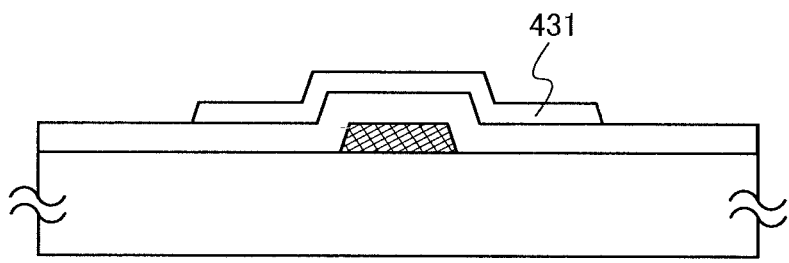
Figure 13C:
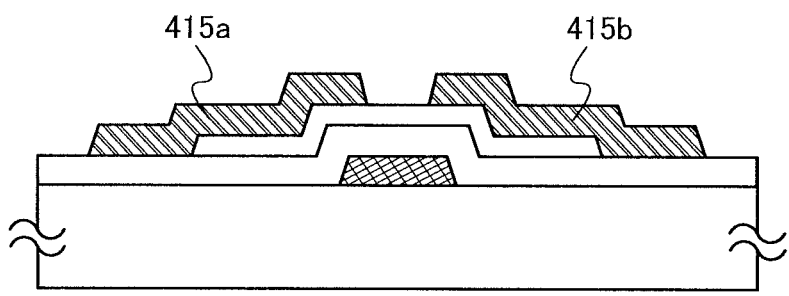
Figure 13D:
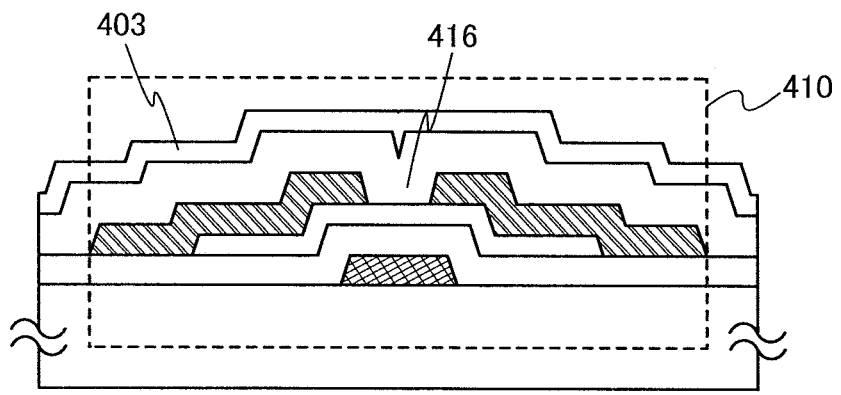

Although a single-gate transistor is illustrated in FIG. 13D, a multi-gate transistor including a plurality of channel regions can be formed when needed.

Steps of forming the transistor 410 over a substrate 400 are described below with reference to FIGS. 13A to 13D.

First, a conductive film is formed over the substrate 400 having an insulating surface. Then, a gate electrode layer 411 is formed through a first photolithography process.

Although there is no particular limitation on a substrate which can be used as the substrate 400 having an insulating surface, it is necessary that the substrate have at least heat resistance high enough to withstand heat treatment to be performed later. For example, a glass substrate including barium borosilicate glass, aluminoborosilicate glass, or the like can be used. In the case where the temperature of the heat treatment to be performed later is high, a glass substrate whose strain point is 730° C. or higher is preferably used.

An insulating film serving as a base film may be provided between the substrate 400 and the gate electrode layer 411. The base film has a function of preventing diffusion of an impurity element from the substrate 400, and can be formed to have a single-layer structure or a layered structure including one or more films selected from a silicon nitride film, a silicon oxide film, a silicon nitride oxide film, or a silicon oxynitride film.

The gate electrode layer 411 can be formed to have a single-layer structure or a layered structure including a metal material such as molybdenum, titanium, chromium, tantalum, tungsten, aluminum, copper, neodymium, or scandium; or an alloy material which contains the metal material as its main component.

Then, a gate insulating layer 402 is formed over the gate electrode layer 411.

The gate insulating layer 402 can be formed to have a single-layer structure or a layered structure including a silicon oxide layer, a silicon nitride layer, a silicon oxynitride layer, a silicon nitride oxide layer, or an aluminum oxide layer by plasma-enhanced CVD, sputtering, or the like. Alternatively, a high-k material such as hafnium oxide (HfO$_x$) or tantalum oxide (TaO$_x$) can be used for the gate insulating layer. The thickness of the gate insulating layer 402 is 100 to 500 nm. In the case where the gate insulating layer 402 is formed to have a layered structure, a first gate insulating layer having a thickness of 50 to 200 nm and a second gate insulating layer having a thickness of 5 to 300 nm are stacked.

In this embodiment, as the gate insulating layer 402, a silicon oxynitride layer is formed to a thickness of 100 nm or less by plasma-enhanced CVD.

Further, as the gate insulating layer 402, a silicon oxynitride layer may be formed using a high-density plasma apparatus. Here, a high-density plasma apparatus refers to an apparatus which can realize a plasma density of $1 \times 10^{11}/cm^3$ or higher. For example, plasma is generated by application of a microwave power of 3 to 6 kW so that an insulating layer is formed. Since the insulating layer formed using the high-density plasma apparatus can have a uniform thickness, the insulating layer has excellent step coverage. Further, as for the insulating layer formed using the high-density plasma apparatus, the thickness of a thin film can be controlled precisely.

The film quality of the insulating layer formed using the high-density plasma apparatus is greatly different from that of an insulating layer formed using a conventional parallel plate PCVD apparatus. The etching rate of the insulating layer formed using the high-density plasma apparatus is lower than that of the insulating layer formed using the conventional parallel plate PCVD apparatus by 10% or more or 20% or more in the case where the etching rates with the same etchant are compared to each other. Thus, it can be said that the insulating layer formed using the high-density plasma apparatus is a dense layer.

An oxide semiconductor (a highly purified oxide semiconductor) which is made to be intrinsic (i-type) or substantially intrinsic in a later step is highly sensitive to an interface state and interface charge; thus, an interface between the oxide semiconductor and the gate insulating layer is important. Thus, the gate insulating layer (GI) which is in contact with the highly purified oxide semiconductor needs high quality. Therefore, high-density plasma-enhanced CVD using microwaves (2.45 GHz) is preferable because a dense high-quality insulating layer having high withstand voltage can be formed. This is because when the highly purified oxide semiconductor is closely in contact with the high-quality gate insulating layer, the interface state can be reduced and interface properties can be favorable. It is important that the gate insulating layer have lower interface state density with an oxide semiconductor and a favorable interface as well as having favorable film quality as a gate insulating layer.

Then, an oxide semiconductor film 430 is formed to a thickness of 2 to 200 nm over the gate insulating layer 402. As the oxide semiconductor film 430, an In—Ga—Zn—O-based oxide semiconductor film, an In—Zn—O-based oxide semiconductor film, or the like is used. In this embodiment, the oxide semiconductor film 430 is deposited by sputtering with the use of an In—Ga—Zn—O-based oxide semiconductor target. A cross-sectional view at this stage corresponds to FIG. 13A. Alternatively, the oxide semiconductor film 430 can be deposited by sputtering in a rare gas (typically argon) atmosphere, an oxygen atmosphere, or an atmosphere including a rare gas (typically argon) and oxygen.

Here, deposition is preformed using a metal oxide target containing In, Ga, and Zn (In$_2$O$_3$:ZnO=1:1:1 [molar ratio]). The deposition condition is set as follows: the distance between the substrate and the target is 100 mm; the pressure is 0.2 Pa; the direct current (DC) power is 0.5 kW; and the atmosphere is an atmosphere containing argon and oxygen (argon:oxygen=30 sccm:20 sccm and the flow rate ratio of oxygen is 40%). Note that it is preferable that pulsed direct-current (DC) power be used because powdery substances generated in deposition can be reduced and the film thickness can be uniform. The thickness of an In—Ga—Zn—O-based film is 5 to 200 nm. In this embodiment, as the oxide semiconductor film, a 20-nm-thick In—Ga—Zn—O-based film is deposited by sputtering with the use of an In—Ga—Zn—O-based metal oxide target. Next, the oxide semiconductor film 430 is processed into an island-shaped oxide semiconductor layer through a second photolithography process.

Then, the oxide semiconductor layer is dehydrated or dehydrogenated. The temperature of first heat treatment for dehydration or dehydrogenation is higher than or equal to 400° C. and lower than or equal to 750° C. preferably higher than or equal to 400° C. and lower than the strain point of the substrate. Here, after the substrate is put in an electric furnace which is a kind of heat treatment apparatus and heat treatment is performed on the oxide semiconductor layer at 450° C. for one hour in a nitrogen atmosphere, water and hydrogen are prevented from being mixed into the oxide semiconductor layer by preventing the substrate from being exposed to the air; thus, oxide semiconductor layer 431 is obtained (see FIG. 13B).

Note that the heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, such as nitrogen or a rare gas such as argon, is used.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

Note that in the atmosphere of the first heat treatment, it is preferable that water, hydrogen, or the like be not contained in nitrogen, a rare gas such as helium, neon, or argon, or dry air. For example, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

In addition, the first heat treatment for the oxide semiconductor layer can be performed on the oxide semiconductor film 430 before being processed into the island-shaped oxide semiconductor layer. In that case, the substrate is taken out of the heat apparatus after the first heat treatment, and then the second photolithography process is performed.

Further, in the case where an opening portion is formed in the gate insulating layer 402, the formation of the opening portion may be performed before or after the oxide semiconductor film 430 is dehydrated or dehydrogenated.

Note that the etching of the oxide semiconductor film 430 here is not limited to wet etching, and dry etching may be employed.

As an etching gas used for dry etching of the oxide semiconductor film 430, a gas containing chlorine (e.g., chlorine ($Cl_2$) or boron trichloride ($BCl_3$)) is preferably used.

As an etchant used for wet etching of the oxide semiconductor film 430, a solution obtained by mixture of phosphoric acid, acetic acid, and nitric acid, an ammonia hydrogen peroxide mixture (a hydrogen peroxide solution at 31 wt %:ammonia water at 28 wt %:water=5:2:2), or the like can be used. Alternatively. ITO-07N (produced by KANTO CHEMICAL CO., INC.) may be used.

Next, a metal conductive film is formed over the gate insulating layer 402 and the oxide semiconductor layer 431. The metal conductive film may be formed by sputtering or vacuum evaporation. As the material of the metal conductive film, an element selected from aluminum (Al), chromium (Cr), copper (Cu), tantalum (Ta), titanium (Ti), molybdenum (Mo), tungsten (W), neodymium (Nd), or scandium (Sc); an alloy including any of the elements; an alloy including any of these elements in combination; or the like can be used. Alternatively, a nitride film of any of the elements may be used. Alternatively, one or more materials selected from manganese (Mn), magnesium (Mg), zirconium (Zr), beryllium (Be), and yttrium (Y) may be used. Further, the metal conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

When heat treatment is performed after the formation of the metal conductive film, it is preferable that the metal conductive film have heat resistance high enough to withstand the heat treatment.

A resist mask is formed over the metal conductive film through a third photolithography process; a source electrode layer 415a and a drain electrode layer 415b are formed by selective etching; then, the resist mask is removed (see FIG. 13C).

In this embodiment, a titanium film is used as the metal conductive film, an In—Ga—Zn—O-based oxide is used for the oxide semiconductor layer 431, and an ammonia hydrogen peroxide solution (a mixture of ammonia, water, and a hydrogen peroxide solution) is used as an etchant.

Note that in the third photolithography process, only part of the oxide semiconductor layer 431 is etched so that an oxide semiconductor layer having a groove (a depression) is formed in some cases.

In order to reduce the number of photomasks used in the photolithography processes and to reduce the number of processes, an etching process may be performed using a multi-tone mask which is an exposure mask through which light is transmitted to have a plurality of intensities. A resist mask formed using a multi-tone mask has a plurality of thicknesses and can be changed in shape by ashing; therefore, the resist mask can be used in a plurality of etching processes for processing films into different patterns. Therefore, a resist mask corresponding to at least two or more kinds of different patterns can be formed by one multi-tone mask. Thus, the number of exposure masks and the number of corresponding photolithography processes can be reduced, so that the process can be simplified.

Next, plasma treatment is performed using a gas such as nitrous oxide ($N_2O$), nitrogen ($N_2$), or argon (Ar). With this plasma treatment, absorbed water and the like which attach to a surface of the oxide semiconductor layer exposed are removed. Alternatively, plasma treatment may be performed using a mixture gas of oxygen and argon.

After the plasma treatment, an oxide insulating layer 416 which serves as a protective insulating film and is in contact with part of the oxide semiconductor layer 431 is formed without exposure to the air.

The oxide insulating layer 416 can be formed to have a thickness of at least 1 nm or more by a method by which an impurity such as water or hydrogen is not mixed into the oxide insulating layer 416, such as sputtering, as appropriate. When hydrogen is contained in the oxide insulating layer 416, hydrogen enters the oxide semiconductor layer, so a backchannel of the oxide semiconductor layer 431 has lower resistance (has n-type conductivity) and a parasitic channel is formed. Therefore, it is important that a deposition method in which hydrogen is not used be employed in order that the oxide insulating layer 416 contain as little hydrogen as possible.

In this embodiment, a 200-nm-thick silicon oxide film is deposited as the oxide insulating layer 416 by sputtering. The substrate temperature at the time of deposition is in the range of from room temperature to 300° C., and 100° C. in this embodiment. The silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, a silicon oxide film can be deposited using a silicon target in an atmosphere including oxygen and nitrogen by sputtering.

Next, second heat treatment (preferably at 200 to 400° C., for example, 250 to 350° C.) is performed in an inert gas atmosphere, a dry air atmosphere, or an oxygen gas atmosphere. For example, the second heat treatment is performed at 250° C. for one hour in a nitrogen atmosphere. Through the second heat treatment, part of the oxide semiconductor layer (a channel region) is heated while being in contact with the oxide insulating layer 416. Thus, oxygen is supplied to the part of the oxide semiconductor layer (the channel region).

Through the above steps, after the heat treatment for dehydration or dehydrogenation is performed on the oxide semiconductor layer, the part of the oxide semiconductor layer (the channel region) is selectively made to be in an oxygen excess state. Through the steps, the transistor 410 is formed.

Further, heat treatment may be performed at 100 to 200° C. for 1 to 30 hours in an air atmosphere. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature.

A protective insulating layer may be formed over the oxide insulating layer 416. For example, a silicon nitride film is formed by RF sputtering. Since RF sputtering has high productivity, it is preferably used as a deposition method of the protective insulating layer. The protective insulating layer is formed using an inorganic insulating film which does not contain an impurity such as moisture, a hydrogen ion, and OH⁻ and blocks entry of such an impurity from the outside, typically a silicon nitride film, an aluminum nitride film, a silicon nitride oxide film, or an aluminum oxynitride film. In this embodiment, as the protective insulating layer, a protective insulating layer 403 is formed using a silicon nitride film (see FIG. 13D).

In this embodiment, the oxide semiconductor layer of the transistor 410 is an intrinsic (i-type) or substantially intrinsic oxide semiconductor layer obtained by removal of hydrogen, which is an n-type impurity, from the oxide semiconductor and the increase in purity so that an impurity other than the main components of the oxide semiconductor is not included as much as possible. In other words, the oxide semiconductor layer of the transistor 410 is a highly purified intrinsic (i-type) semiconductor layer or a semiconductor layer which is close to a highly purified i-type semiconductor layer not by addition of an impurity but by removal of an impurity such as hydrogen or water as much as possible. In this manner, the Fermi level ($E_f$) can be equal to the intrinsic Fermi level ($E_i$).

It is said that the band gap ($E_g$) of the oxide semiconductor is 3.15 eV and electron affinity ($\chi$) is 4.3 eV. The work function of titanium (Ti) used for the source electrode layer and the drain electrode layer is substantially equal to the electron affinity ($\chi$) of the oxide semiconductor. In this case, the Schottky electron barrier is not formed at an interface between the metal and the oxide semiconductor.

For example, even in the case of a transistor whose channel width W is $1\times10^4$ μm and whose channel length L is 3 μm, off-state current at room temperature can be $10^{-13}$ A or less and a subthreshold swing can be 0.1 V/decade (the thickness of the gate insulating layer is 100 nm).

By the increase in purity so that an impurity other than the main components of the oxide semiconductor is not included as much as possible in this manner, the transistor 410 can operate favorably.

In order to prevent variation in electrical characteristics of the oxide semiconductor, an impurity that causes the variation, such as hydrogen, moisture, a hydroxyl group, or hydride (also referred to as a hydrogen compound), is intentionally removed. Additionally, the oxide semiconductor becomes a highly purified electrically i-type (intrinsic) oxide semiconductor by supply of oxygen which is a main component of the oxide semiconductor that is simultaneously reduced in a step of removing the impurity.

Therefore, it is preferable that the amount of hydrogen in the oxide semiconductor be as small as possible. Further, the number of carriers in the highly purified oxide semiconductor is significantly small (close to zero), and the carrier density is lower than $1\times10^{12}$/cm³, preferably $1\times10^{11}$/cm³ or lower. That is, the carrier density of the oxide semiconductor layer can be extremely close to zero. Since the number of carriers in the oxide semiconductor layer is significantly small, the off-state current of the transistor can be reduced. It is preferable that the off-state current be as low as possible. The amount of current per micrometer of the channel width (W) in the transistor is 100 aA or less, preferably 10 zA (zepto-ampere)/μm or less, more preferably 1 zA/μm or less. Further, the transistor has no pn junction and does not deteriorate due to hot carriers; thus, the electrical characteristics of the transistor are not adversely affected.

In a transistor whose channel region includes an oxide semiconductor which is highly purified by drastic removal of hydrogen contained in an oxide semiconductor layer as described above, the amount of off-state current can be significantly reduced. In other words, in circuit design, the oxide semiconductor layer can be regarded as an insulator when the transistor is off. In contrast, it can be estimated that the oxide semiconductor layer has better current supply capability than a semiconductor layer including amorphous silicon when the transistor is on.

A transistor including low-temperature polysilicon is designed on the assumption that off-state current is about 10000 times that of a transistor including an oxide semiconductor. Therefore, in the case where the transistor including an oxide semiconductor is compared with the transistor including low-temperature polysilicon, the voltage hold time of the transistor including an oxide semiconductor can be extended about 10000 times when storage capacitances are equal or substantially equal to each other (about 0.1 pF). For example, when moving images are displayed at 60 fps, the hold time for one signal writing can be approximately 160 seconds, which is 10000 times that of the transistor including low-temperature polysilicon. In this manner, still images can be displayed on a display portion even by less frequent writing of image signals.

Embodiment 4

In this embodiment, an example of a display device which is one embodiment of the present invention is described.

Figure 14A:
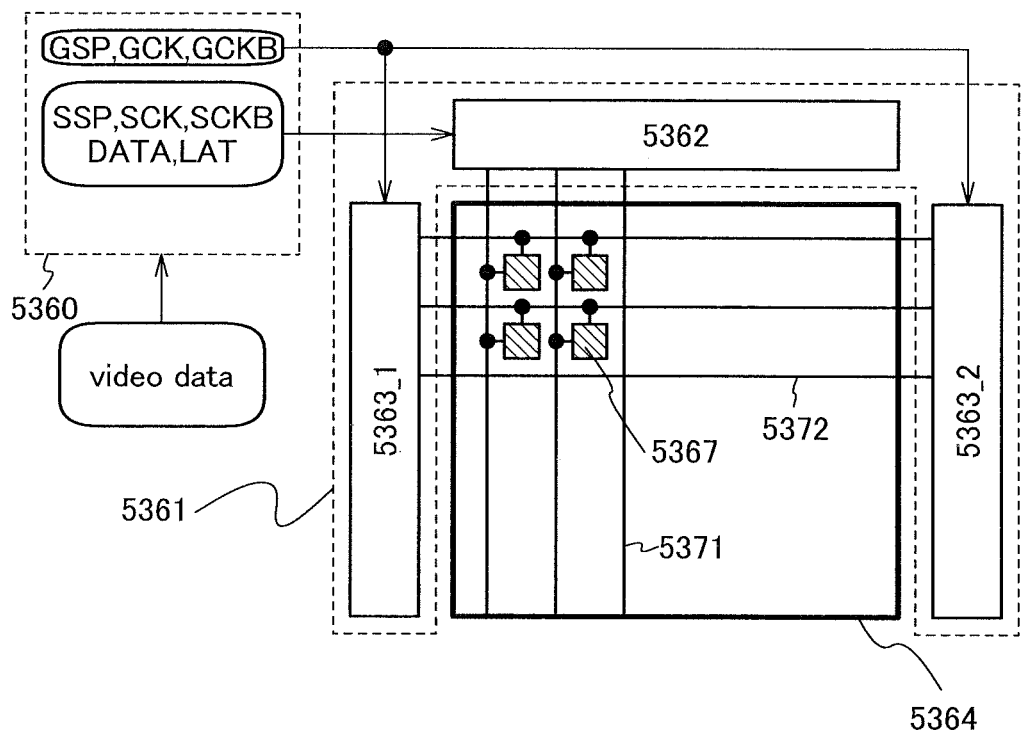
FIGS. 14A to 14C illustrate structures of display devices in Embodiment 4.

FIG. 14A illustrates an example of a display device including the shift register circuit in Embodiment 2. The display device illustrated in FIG. 14A includes a timing controller 5360, a driver circuit 5361 having, a source driver circuit 5362, a gate driver circuit 5363_1, and a gate driver circuit 5363_2, and a pixel portion 5364. A plurality of source signal lines 5371 which extend from the source driver circuit 5362 and a plurality of gate signal lines 5372 which extend from the gate driver circuits 5363_1 and 5363_2 are provided in the pixel portion 5364. Pixels 5367 are provided in matrix in regions where the plurality of source signal lines 5371 and the plurality of gate signal lines 5372 intersect with each other.

Note that the display device can include a lighting device, a control circuit thereof, and the like. In that case, the pixel 5367 preferably includes a liquid crystal element.

Note that it is possible not to provide one of the gate driver circuit 5363_1 and the gate driver circuit 5363_2.

The timing controller 5360 has a function of controlling the operation of the driver circuit 5361 by supplying a control signal to the driver circuit 5361. For example, the timing controller 5360 supplies a control signal such as a start signal SSP, a clock signal SCK, an inverted clock signal SCKB, a video signal DATA, or a latch signal LAT to the source driver circuit 5362. Further, the timing controller 5360 supplies a control signal such as a start signal GSP, a clock signal GCK, or an inverted clock signal GCKB to the gate driver circuit 5363_1 and the gate driver circuit 5363_2.

The source driver circuit 5362 has a function of outputting video signals to the plurality of source signal lines 5371. The source driver circuit 5362 can be referred to as a driver circuit, a signal line driver circuit, or the like. Video signals are input to the pixels 5367. Display elements included in the pixels 5367 express gradation in accordance with the video signals.

The gate driver circuit 5363_1 and the gate driver circuit 5363_2 each have a function of sequentially selecting the pixels 5367 in rows. Each of the gate driver circuit 5363_1 and the gate driver circuit 5363_2 can be referred to as a driver circuit or a scan line driver circuit. Timing of selecting the pixels 5367 is controlled when the gate driver circuit

5363_1 and the gate driver circuit 5363_2 output gate signals to the gate signal lines 5372.

Figure 14B:
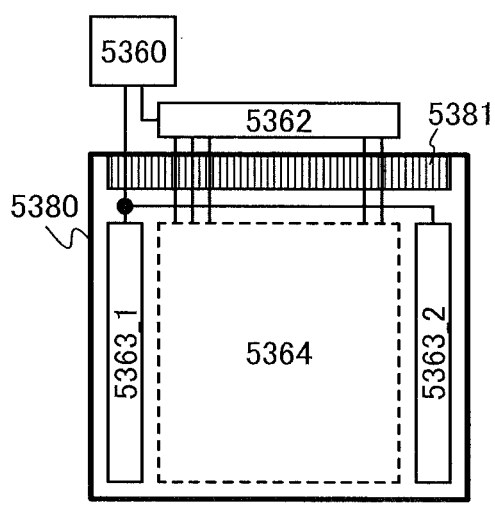

Note that in the display device illustrated in FIG. 14A, the gate driver circuit 5363_1 and the gate driver circuit 5363_2 can be formed over the same substrate as the pixel portion 5364. FIG. 14B illustrates an example of the case where the gate driver circuit 5363_1 and the gate driver circuit 5363_2 are formed over the same substrate as the pixel portion 5364 (a substrate 5380). Note that the substrate 5380 and an external circuit are connected to each other through a terminal 5381.

Figure 14C:
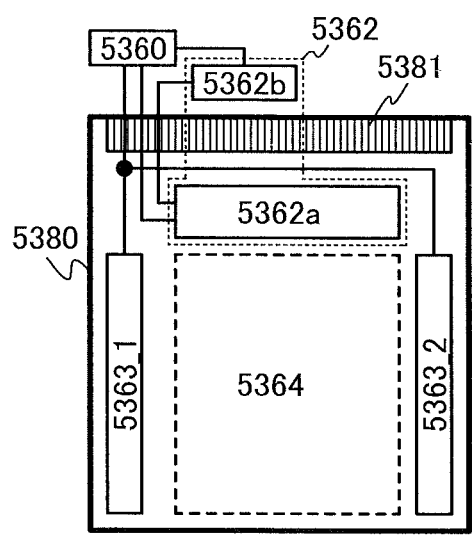

Note that in the display device illustrated in FIG. 14A, part of the source driver circuit 5362 (e.g., a switch, a multiplexer, a shift register circuit, a decoder circuit, an inverter circuit, a buffer circuit, and/or a level shifter circuit) can be formed over the same substrate as the pixel portion 5364. FIG. 14C illustrates an example of the case where the gate driver circuit 5363_1, the gate driver circuit 5363_2, part of the source driver circuit 5362 (denoted by a reference numeral 5362a) are formed over the same substrate as the pixel portion 5364 (the substrate 5380) and another part of the source driver circuit 5362 (denoted by a reference numeral 5362b) is formed over a substrate which is different from the substrate 5380.

The shift register circuit in Embodiment 2 can be used as the driver circuit of the display device or part of the driver circuit. In particular, when the driver circuit of the display device includes the transistor described in Embodiment 3, the usage of the shift register circuit in Embodiment 2 enables improvement in the drive capability of the driver circuit. Thus, the display device can be made large. Alternatively, the resolution of the display portion can be improved. Alternatively, the layout area of the driver circuit can be reduced, thus, the frame of the display device can be reduced.

Embodiment 5

In this embodiment, examples of electronic devices are described.

FIGS. 15A to 15H and FIGS. 16A to 16D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 15A:
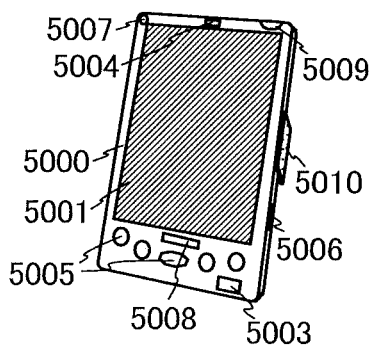
FIGS. 15A to 15H illustrate devices for realizing the technical idea of the present invention.
Figure 15B:
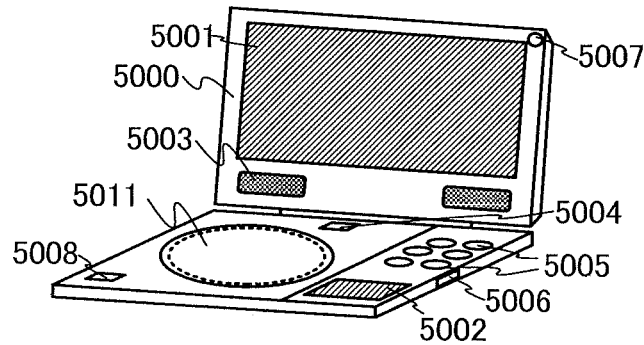
Figure 15C:
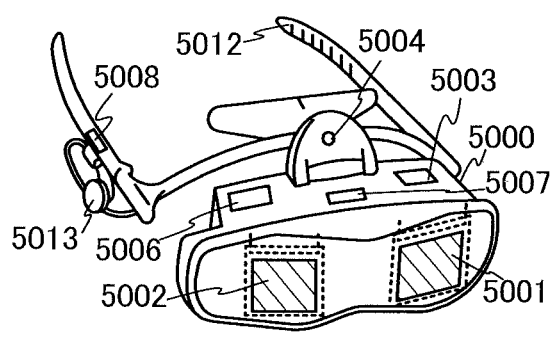
Figure 15D:
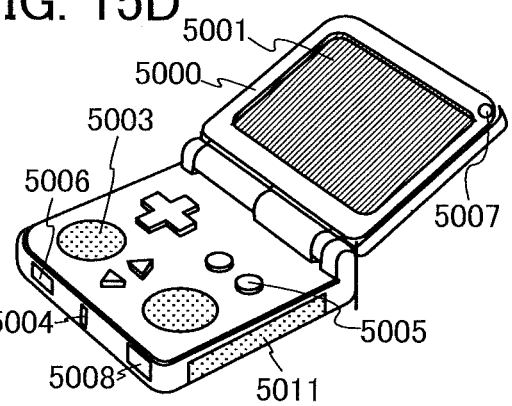
Figure 15E:
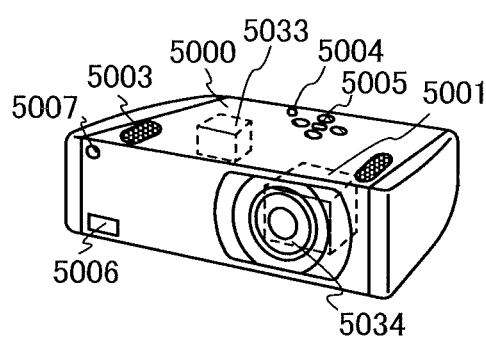
Figure 15F:
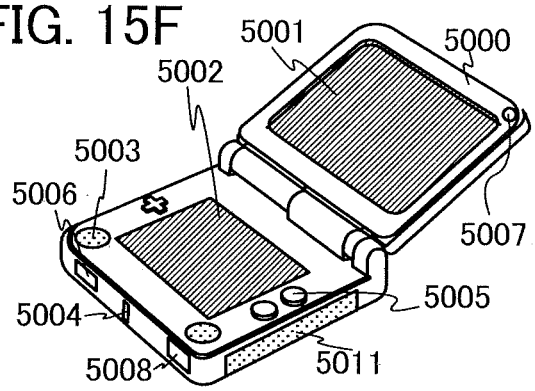
Figure 15G:
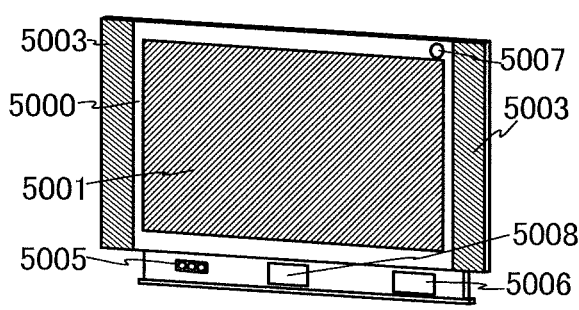
Figure 15H:
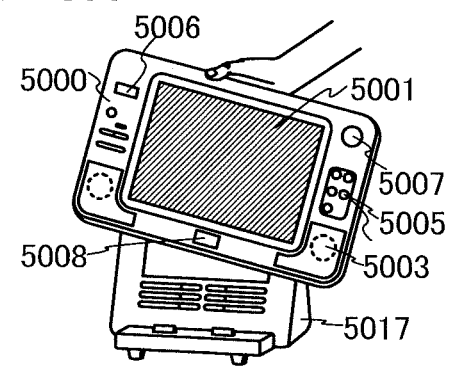
Figure 16A:
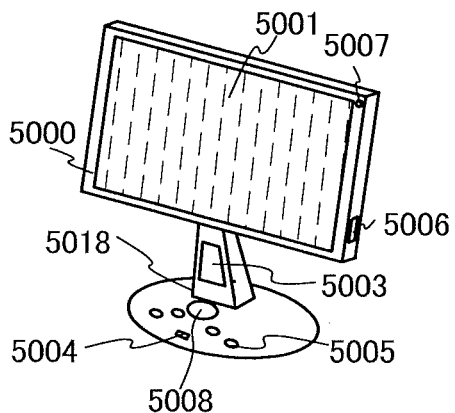
FIGS. 16A to 16H illustrate devices for realizing the technical idea of the present invention.
Figure 16B:
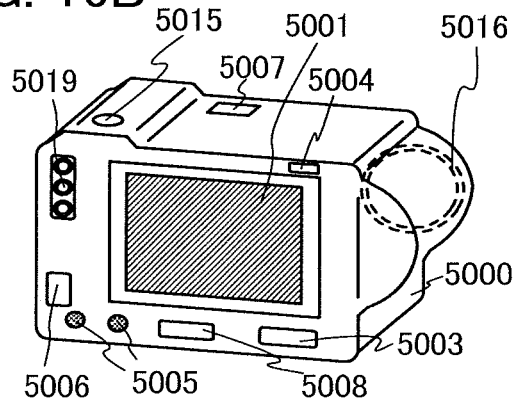
Figure 16C:
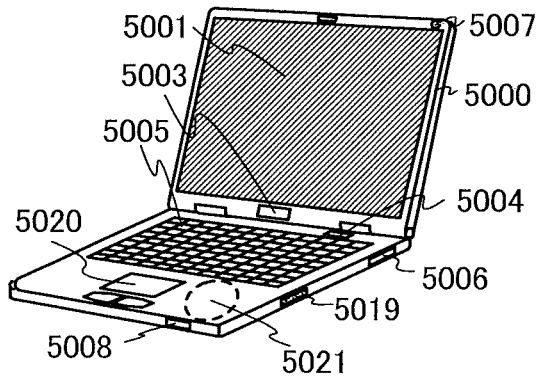
Figure 16D:
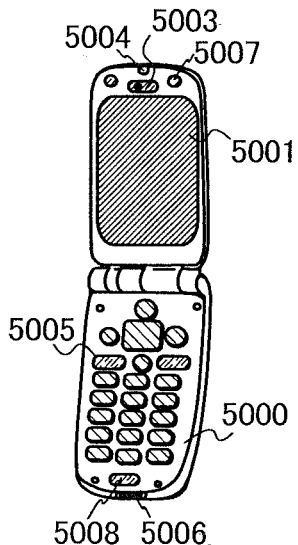

FIG. 15A illustrates a mobile computer, which can include a switch 5009, an infrared port 5010, and the like in addition to the above objects. FIG. 15B illustrates a portable image reproducing device provided with a memory medium (e.g., a DVD reproducing device), which can include a second display portion 5002, a memory medium read portion 5011, and the like in addition to the above objects. FIG. 15C illustrates a goggle-type display, which can include the second display portion 5002, a support 5012, an earphone 5013, and the like in addition to the above objects. FIG. 15D illustrates a portable game machine, which can include the memory medium read portion 5011 and the like in addition to the above objects. FIG. 15E illustrates a projector, which can include a light source 5033, a projector lens 5034, and the like in addition to the above objects. FIG. 15F illustrates a portable game machine, which can include the second display portion 5002, the memory medium read portion 5011, and the like in addition to the above objects. FIG. 15G illustrates a television receiver, which can include a tuner, an image processing portion, and the like in addition to the above objects. FIG. 15H illustrates a portable television receiver, which can include a charger 5017 capable of transmitting and receiving signals and the like in addition to the above objects. FIG. 16A illustrates a display, which can include a support base 5018 and the like in addition to the above objects. FIG. 16B illustrates a camera, which can include an external connection port 5019, a shutter button 5015, an image reception portion 5016, and the like in addition to the above objects. FIG. 16C illustrates a computer, which can include a pointing device 5020, the external connection port 5019, a reader/writer 5021, and the like in addition to the above objects. FIG. 16D illustrates a mobile phone, which can include an antenna, a tuner of one-segment (1 seg digital TV broadcasts) partial reception service for mobile phones and mobile terminals, and the like in addition to the above objects.

The electronic devices illustrated in FIGS. 15A to 15H and FIGS. 16A to 16D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 15A to 15H and FIGS. 16A to 16D are not limited them, and the electronic devices can have a variety of functions.

Figure 16E:
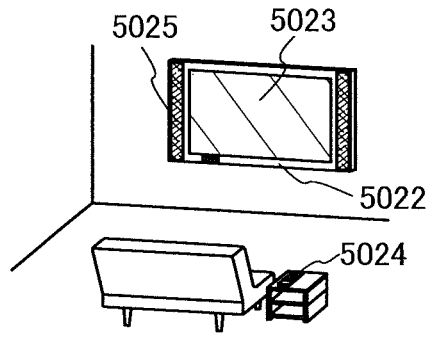

FIG. 16E illustrates an example in which a display device is incorporated in a building structure. FIG. 16E illustrates a housing 5022, a display portion 5023, a remote controller 5024 which is an operation portion, a speaker 5025, and the like. The display device is incorporated in the building structure as a wall-hanging type and can be provided without requiring a large space.

Figure 16F:
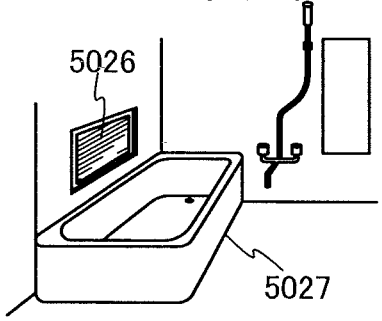

FIG. 16F illustrates another example in which a display device is incorporated in a building structure. A display panel 5026 is incorporated in a prefabricated bath unit 5027, so that a bather can view the display panel 5026.

Note that although this embodiment describes the wall and the prefabricated bath unit as examples of the building structures, this embodiment is not limited to them. The display devices can be provided in a variety of building structures.

Next, examples in which display devices are incorporated in moving objects are described.

Figure 16G:
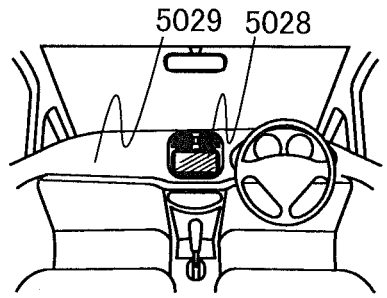

FIG. 16G illustrates an example in which a display device is incorporated in a car. A display panel 5028 is incorporated in a car body 5029 of the car and can display information related to the operation of the car or information input from inside or outside of the car on demand. Note that the display panel 5028 may have a navigation function.

Figure 16H:
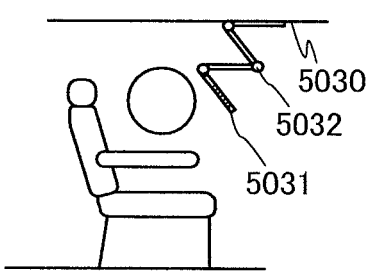

FIG. 16H illustrates an example in which a display device is incorporated in a passenger airplane. FIG. 16H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

The shift register circuit in Embodiment 2 is preferably incorporated in the electronic device described in this embodiment. In particular, the shift register circuit in Embodiment 2 is preferably incorporated as a circuit for driving the display portion of the electronic device. When the shift register in Embodiment 2 is incorporated as a circuit for driving the display portion of the electronic device, the area of a driver circuit can be reduced and the size of the display portion can be increased. Further, the resolution of the display portion can be improved.

This application is based on Japanese Patent Application serial no. 2010-033669 filed with Japan Patent Office on Feb. 18, 2010, the entire contents of which are hereby incorporated by reference.

The invention claimed is:

1. A semiconductor device comprising:
   first to eleventh transistors,
   wherein one of a source and a drain of the first transistor is electrically connected to a first output line,
   wherein the other of the source and the drain of the first transistor is electrically connected to a first clock signal line,
   wherein one of a source and a drain of the second transistor is electrically connected to the first output line,
   wherein one of a source and a drain of the third transistor is electrically connected to a second output line,
   wherein the other of the source and the drain of the third transistor is electrically connected to the first clock signal line,
   wherein a gate of the third transistor is electrically connected to a gate of the first transistor,
   wherein one of a source and a drain of the fourth transistor is electrically connected to the second output line,
   wherein the other of the source and the drain of the fourth transistor is electrically connected to a power supply line,
   wherein a gate of the fourth transistor is electrically connected to a gate of the second transistor,
   wherein one of a source and a drain of the fifth transistor is electrically connected to the gate of the first transistor,
   wherein the other of the source and the drain of the fifth transistor is electrically connected to the power supply line,
   wherein a gate of the fifth transistor is electrically connected to the gate of the second transistor,
   wherein one of a source and a drain of the sixth transistor is electrically connected to the gate of the first transistor,
   wherein the other of the source and the drain of the sixth transistor is electrically connected to a first signal line,
   wherein one of a source and a drain of the seventh transistor is electrically connected to the gate of the first transistor,
   wherein the other of the source and the drain of the seventh transistor is electrically connected to the power supply line,
   wherein a gate of the seventh transistor is electrically connected to a second signal line,
   wherein one of a source and a drain of the eighth transistor is electrically connected to a first line,
   wherein the other of the source and the drain of the eighth transistor is electrically connected to the gate of the second transistor,
   wherein one of a source and a drain of the ninth transistor is electrically connected to the gate of the second transistor,
   wherein the other of the source and the drain of the ninth transistor is electrically connected to the power supply line,
   wherein a gate of the ninth transistor is electrically connected to the gate of the first transistor,
   wherein one of a source and a drain of the tenth transistor is electrically connected to the first line,
   wherein the other of the source and the drain of the tenth transistor is electrically connected to a gate of the eighth transistor,
   wherein a gate of the tenth transistor is electrically connected to the first line,
   wherein one of a source and a drain of the eleventh transistor is electrically connected to the gate of the eighth transistor,
   wherein the other of the source and the drain of the eleventh transistor is electrically connected to the power supply line,
   wherein a gate of the eleventh transistor is electrically connected to the gate of the first transistor, and
   wherein the sixth transistor is configured to control a timing of when a potential of the first signal line is supplied to the gate of the first transistor, the gate of the third transistor, the gate of the ninth transistor, and the gate of the eleventh transistor through a channel formation region of the sixth transistor.

2. The semiconductor device according to claim 1,
   wherein a ratio W/L of a channel width W to a channel length L of the first transistor is larger than a ratio W/L of a channel width W to a channel length L of the second transistor,
   wherein the ratio W/L of the channel width W to the channel length L of the first transistor is larger than a ratio W/L of a channel width W to a channel length L of the fifth transistor, wherein the ratio W/L of the channel width W to the channel length L of the first transistor is larger than a ratio W/L of a channel width W to a channel length L of the sixth transistor, and wherein the ratio W/L of the channel width W to the channel length L of the first transistor is larger than a ratio W/L of a channel width W to a channel length L of the seventh transistor.

3. A semiconductor device comprising:

first to eleventh transistors, wherein one of a source and a drain of the first transistor is directly connected to a first output line, wherein the other of the source and the drain of the first transistor is directly connected to a first clock signal line, wherein one of a source and a drain of the second transistor is directly connected to the first output line, wherein one of a source and a drain of the third transistor is directly connected to a second output line, wherein the other of the source and the drain of the third transistor is directly connected to the first clock signal line, wherein a gate of the third transistor is directly connected to a gate of the first transistor, wherein one of a source and a drain of the fourth transistor is directly connected to the second output line, wherein the other of the source and the drain of the fourth transistor is directly connected to a power supply line, wherein a gate of the fourth transistor is directly connected to a gate of the second transistor, wherein one of a source and a drain of the fifth transistor is directly connected to the gate of the first transistor, wherein the other of the source and the drain of the fifth transistor is directly connected to the power supply line, wherein a gate of the fifth transistor is directly connected to the gate of the second transistor, wherein one of a source and a drain of the sixth transistor is directly connected to the gate of the first transistor, wherein the other of the source and the drain of the sixth transistor is directly connected to a first signal line, wherein one of a source and a drain of the seventh transistor is directly connected to the gate of the first transistor, wherein the other of the source and the drain of the seventh transistor is directly connected to the power supply line, wherein a gate of the seventh transistor is directly connected to a second signal line, wherein one of a source and a drain of the eighth transistor is directly connected to a first line, wherein the other of the source and the drain of the eighth transistor is directly connected to the gate of the second transistor, wherein one of a source and a drain of the ninth transistor is directly connected to the gate of the second transistor, wherein the other of the source and the drain of the ninth transistor is directly connected to the power supply line, wherein a gate of the ninth transistor is directly connected to the gate of the first transistor, wherein one of a source and a drain of the tenth transistor is directly connected to the first line, wherein the other of the source and the drain of the tenth transistor is directly connected to a gate of the eighth transistor, wherein a gate of the tenth transistor is directly connected to the first line, wherein one of a source and a drain of the eleventh transistor is directly connected to the gate of the eighth transistor, wherein the other of the source and the drain of the eleventh transistor is directly connected to the power supply line, wherein a gate of the eleventh transistor is directly connected to the gate of the first transistor, and wherein the sixth transistor is configured to control a timing of when a potential of the first signal line is supplied to the gate of the first transistor, the gate of the third transistor, the gate of the ninth transistor, and the gate of the eleventh transistor through a channel formation region of the sixth transistor.

4. The semiconductor device according to claim 3, wherein a ratio W/L of a channel width W to a channel length L of the first transistor is larger than a ratio W/L of a channel width W to a channel length L of the second transistor, wherein the ratio W/L of the channel width W to the channel length L of the first transistor is larger than a ratio W/L of a channel width W to a channel length L of the fifth transistor, wherein the ratio W/L of the channel width W to the channel length L of the first transistor is larger than a ratio W/L of a channel width W to a channel length L of the sixth transistor, and wherein the ratio W/L of the channel width W to the channel length L of the first transistor is larger than a ratio W/L of a channel width W to a channel length L of the seventh transistor.

5. A semiconductor device comprising:

first to eleventh transistors, wherein one of a source and a drain of the first transistor constantly has electrical continuity with a first output line, wherein the other of the source and the drain of the first transistor constantly has electrical continuity with a first clock signal line, wherein one of a source and a drain of the second transistor constantly has electrical continuity with the first output line, wherein one of a source and a drain of the third transistor constantly has electrical continuity with a second output line, wherein the other of the source and the drain of the third transistor constantly has electrical continuity with the first clock signal line, wherein a gate of the third transistor constantly has electrical continuity with a gate of the first transistor, wherein one of a source and a drain of the fourth transistor constantly has electrical continuity with the second output line, wherein the other of the source and the drain of the fourth transistor constantly has electrical continuity with a power supply line, wherein a gate of the fourth transistor constantly has electrical continuity with a gate of the second transistor, wherein one of a source and a drain of the fifth transistor constantly has electrical continuity with the gate of the first transistor, wherein the other of the source and the drain of the fifth transistor constantly has electrical continuity with the power supply line, wherein a gate of the fifth transistor constantly has electrical continuity with the gate of the second transistor, wherein one of a source and a drain of the sixth transistor constantly has electrical continuity with the gate of the first transistor, wherein the other of the source and the drain of the sixth transistor constantly has electrical continuity with a first signal line, wherein one of a source and a drain of the seventh transistor constantly has electrical continuity with the gate of the first transistor, wherein the other of the source and the drain of the seventh transistor constantly has electrical continuity with the power supply line, wherein a gate of the seventh transistor constantly has electrical continuity with a second signal line, wherein one of a source and a drain of the eighth transistor constantly has electrical continuity with a first line, wherein the other of the source and the drain of the eighth transistor constantly has electrical continuity with the gate of the second transistor, wherein one of a source and a drain of the ninth transistor constantly has electrical continuity with the gate of the second transistor, wherein the other of the source and the drain of the ninth transistor constantly has electrical continuity with the power supply line, wherein a gate of the ninth transistor constantly has electrical continuity with the gate of the first transistor, wherein one of a source and a drain of the tenth transistor constantly has electrical continuity with the first line, wherein the other of the source and the drain of the tenth transistor constantly has electrical continuity with a gate of the eighth transistor, wherein a gate of the tenth transistor constantly has electrical continuity with the first line, wherein one of a source and a drain of the eleventh transistor constantly has electrical continuity with the gate of the eighth transistor, wherein the other of the source and the drain of the eleventh transistor constantly has electrical continuity with the power supply line, wherein a gate of the eleventh transistor constantly has electrical continuity with the gate of the first transistor, and wherein the sixth transistor is configured to control a timing of when a potential of the first signal line is supplied to the gate of the first transistor, the gate of the third transistor, the gate of the ninth transistor, and the gate of the eleventh transistor through a channel formation region of the sixth transistor.

6. The semiconductor device according to claim 5, wherein a ratio W/L of a channel width W to a channel length L of the first transistor is larger than a ratio W/L of a channel width W to a channel length L of the second transistor, wherein the ratio W/L of the channel width W to the channel length L of the first transistor is larger than a ratio W/L of a channel width W to a channel length L of the fifth transistor, wherein the ratio W/L of the channel width W to the channel length L of the first transistor is larger than a ratio W/L of a channel width W to a channel length L of the sixth transistor, and wherein the ratio W/L of the channel width W to the channel length L of the first transistor is larger than a ratio W/L of a channel width W to a channel length L of the seventh transistor.

* * * * *